(12) United States Patent
Sun et al.

(10) Patent No.: US 11,937,436 B2
(45) Date of Patent: Mar. 19, 2024

(54) MAGNETORESISTIVE DEVICES AND METHODS THEREFOR

(71) Applicant: Everspin Technologies, Inc., Chandler, AZ (US)

(72) Inventors: Jijun Sun, Chandler, AZ (US); Han-Jong Chia, Hsinchu (TW); Sarin Deshpande, San Jose, CA (US); Ahmet Demiray, Chandler, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 454 days.

(21) Appl. No.: 17/285,122

(22) PCT Filed: Oct. 29, 2019

(86) PCT No.: PCT/US2019/058532
§ 371 (c)(1),
(2) Date: Apr. 14, 2021

(87) PCT Pub. No.: WO2020/092347
PCT Pub. Date: May 7, 2020

(65) Prior Publication Data
US 2021/0359201 A1    Nov. 18, 2021

Related U.S. Application Data

(60) Provisional application No. 62/752,667, filed on Oct. 30, 2018.

(51) Int. Cl.
*H10B 61/00*    (2023.01)
*H10N 30/50*    (2023.01)
(Continued)

(52) U.S. Cl.
CPC ............. *H10B 61/10* (2023.02); *H10B 61/00* (2023.02); *H10B 61/20* (2023.02); *H10N 30/50* (2023.02);
(Continued)

(58) Field of Classification Search
CPC ........ H10B 61/00; H10B 61/10; H10N 30/50; H10N 35/80
See application file for complete search history.

(56) References Cited

U.S. PATENT DOCUMENTS 6,473,275 B1    10/2002  Gill
2012/0313191 A1    12/2012  Whig et al.
(Continued)

FOREIGN PATENT DOCUMENTS

| CN | 103608861 A | 2/2014 |
| CN | 104995685 A | 10/2015 |
| CN | 105229811 A | 1/2016 |

OTHER PUBLICATIONS

International Search Report and Written Opinion in International Application No. PCT/US2019/058532, dated Feb. 24, 2020 (11 pages).

(Continued)

*Primary Examiner* — David A Zarneke
(74) *Attorney, Agent, or Firm* — Bookoff McAndrews, PLLC

(57) ABSTRACT

A magnetoresistive stack includes a fixed magnetic region, one or more dielectric layers disposed on and in contact with the fixed magnetic region, and a free magnetic region disposed above the one or mom dielectric layers. The fixed magnetic region may include a first ferromagnetic region, a coupling layer, a second ferromagnetic region, a transition layer disposed, a reference layer, and at least one interfacial layer disposed above the second ferromagnetic region.
(Continued)

Another interfacial layer may be disposed between the one or more dielectric layers and the free magnetic region.

20 Claims, 16 Drawing Sheets

(51) Int. Cl.
  *H10N 35/80* (2023.01)
  *H10N 50/10* (2023.01)
  *H10N 50/80* (2023.01)
  *H10N 50/85* (2023.01)
(52) U.S. Cl.
  CPC ............. *H10N 35/80* (2023.02); *H10N 50/10* (2023.02); *H10N 50/80* (2023.02); *H10N 50/85* (2023.02)

(56) References Cited

U.S. PATENT DOCUMENTS

| | | |
|---|---|---|
| 2014/0197504 A1 | 7/2014 | Moriyama et al. |
| 2017/0170388 A1 | 6/2017 | Whig et al. |
| 2018/0123027 A1 | 5/2018 | Yamane et al. |
| 2018/0130943 A1 | 5/2018 | Naik et al. |

OTHER PUBLICATIONS

Chinese Office Action dated Oct. 21, 2023 in counterpart Chinese Patent Application No. 201980067411.3 (17 pages, with English translation).

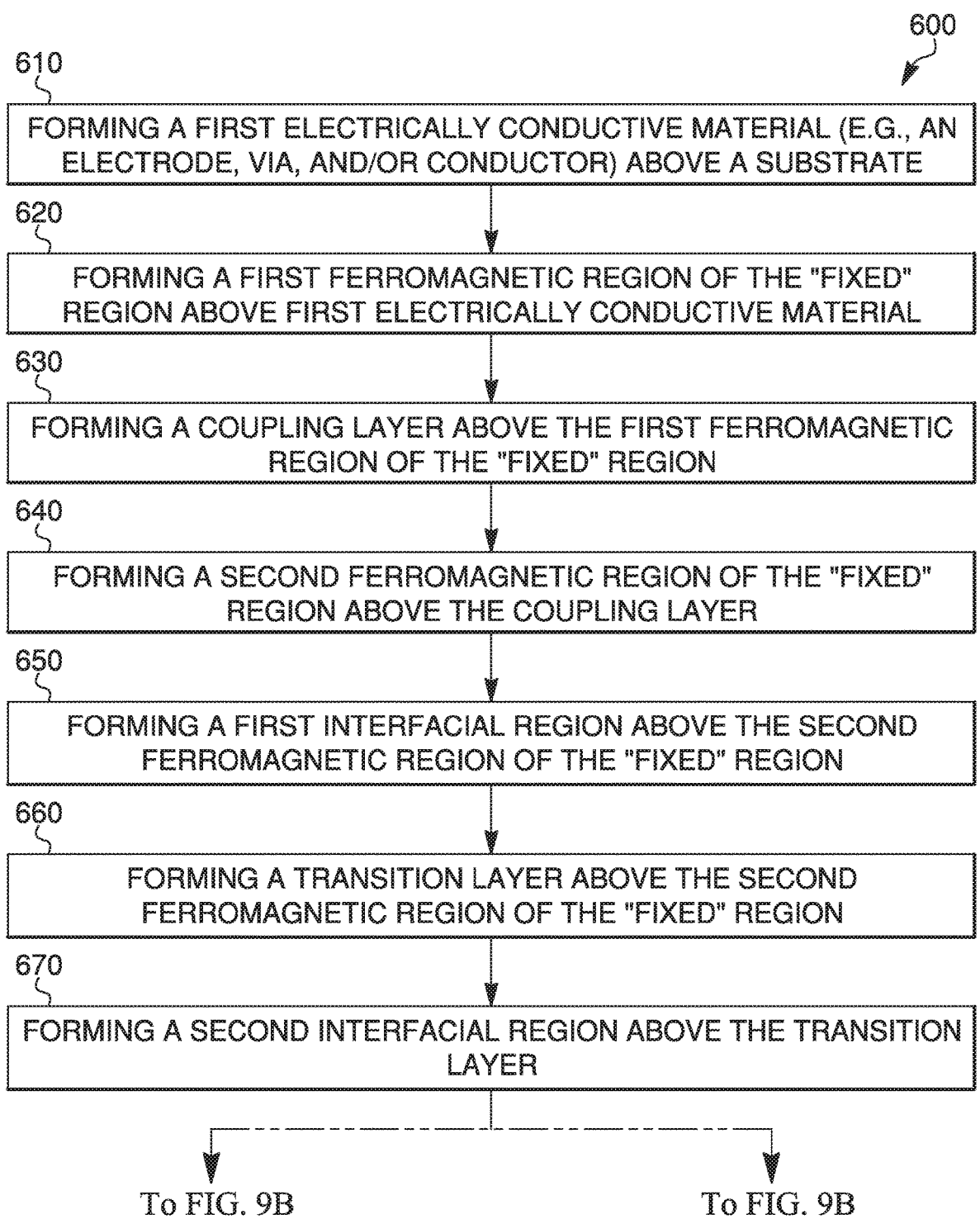

MAGNETORESISTIVE DEVICES AND METHODS THEREFOR

CROSS-REFERENCE TO RELATED APPLICATIONS

This application is the U.S. national phase entry under 35 U.S.C. § 371 of International Application No. PCT/US2019/058532, filed on Oct. 29, 2019, which claims the benefit of priority from U.S. Provisional Application Ser. No. 62/752,667, filed on Oct. 30, 2018, each of which is incorporated by reference herein in its entirety.

TECHNICAL FIELD

The present disclosure relates to, among other things, magnetoresistive stacks and methods of manufacturing magnetoresistive stacks. More specifically, embodiments of the present disclosure are directed to magnetoresistive stacks including one or more materials or characteristics configured to reduce encroachment, and methods of manufacturing such magnetoresistive stacks

Introduction

There are many inventions described and illustrated herein, as well as many aspects and embodiments of those inventions. In one aspect, the present disclosure relates to magnetoresistive structures (for example, part of a magnetoresistive memory device, magnetoresistive sensor/transducer device, etc.) and methods of manufacturing the described magnetoresistive structures. For example, the disclosed structures may be related to magnetoresistive random access memory (MRAM) devices, magnetoresistive sensor/transducer devices, etc. To describe aspects of the disclosed devices and methods, exemplary magnetoresistive stack configurations are described. However, these are only exemplary. The disclosed devices can have many other stack configurations, and the disclosed methods can be applied to manufacture magnetoresistive devices having various suitable magnetoresistive stacks.

Briefly, a magnetoresistive stack used in a memory device (e.g., an MRAM device) includes at least one non-magnetic layer (for example, at least one dielectric layer or a non-magnetic yet electrically conductive layer) disposed between a fixed magnetic region and a free magnetic region, each including one or more layers of ferromagnetic materials. Information may be stored in the magnetoresistive stack by switching, programming, and/or controlling the direction of magnetization vectors in the magnetic layer(s) of the free magnetic region. The direction of the magnetization vectors of the free magnetic region may be switched and/or programmed (for example, through spin transfer torque (STT)) by application of a write signal (e.g., one or more current pulses) adjacent to, or through, the magnetoresistive memory stack. In contrast, the magnetization vectors in the magnetic layers of a fixed magnetic region are magnetically fixed in a predetermined direction. When the magnetization vectors of the free magnetic region adjacent to the non-magnetic layer are in the same direction as the magnetization vectors of the fixed magnetic region adjacent to the non-magnetic layer, the magnetoresistive memory stack has a first magnetic state.

Conversely, when the magnetization vectors of the free magnetic region adjacent to the non-magnetic layer are opposite the direction of the magnetization vectors of the fixed magnetic region adjacent to the non-magnetic layer, the magnetoresistive memory stack has a second magnetic state. The magnetic regions on either side of the non-magnetic layer forms a magnetic tunnel junction (MTJ) when the non-magnetic layer is a dielectric material. The MTJ has different electrical resistances in the first and second magnetic states. For example, a resistance of the second magnetic state may be relatively higher than a resistance of the first magnetic state. The magnetic state of the magnetoresistive memory stack is determined or read based on the resistance of the stack in response to a read current applied, for example, through the magnetoresistive stack.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and/or gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s). Further, even though the figures and this written disclosure appear to describe the magnetoresistive stacks of the disclosed magnetoresistive devices in a particular order of construction (e.g., from bottom to top), it is understood that the depicted magnetoresistive stacks may have a different order (e.g., the opposite order (i.e., from top to bottom)).

Figure 1B:
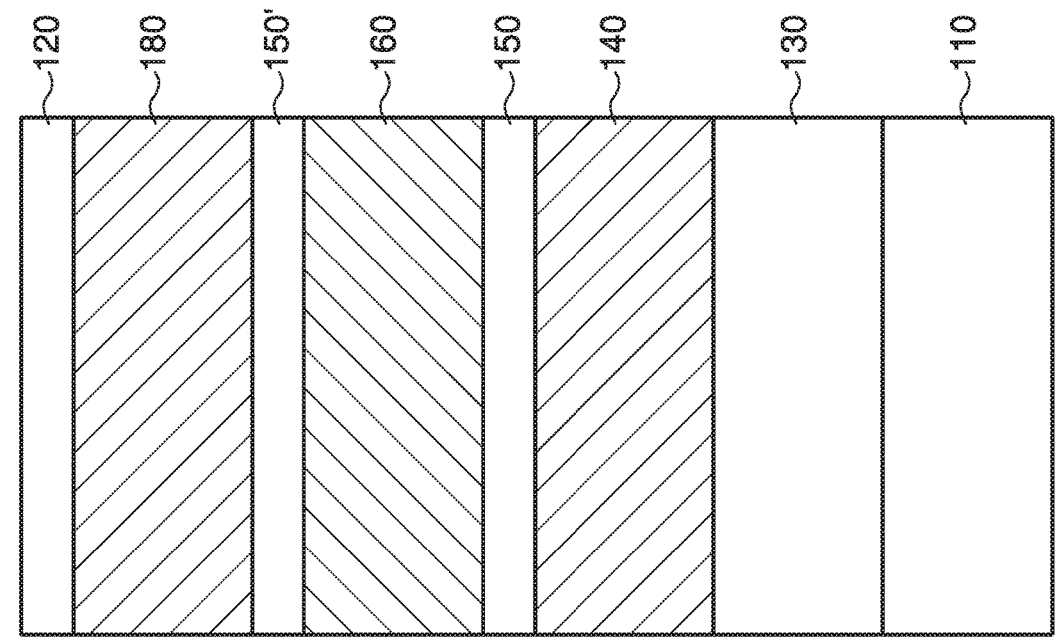
Figure 1A:
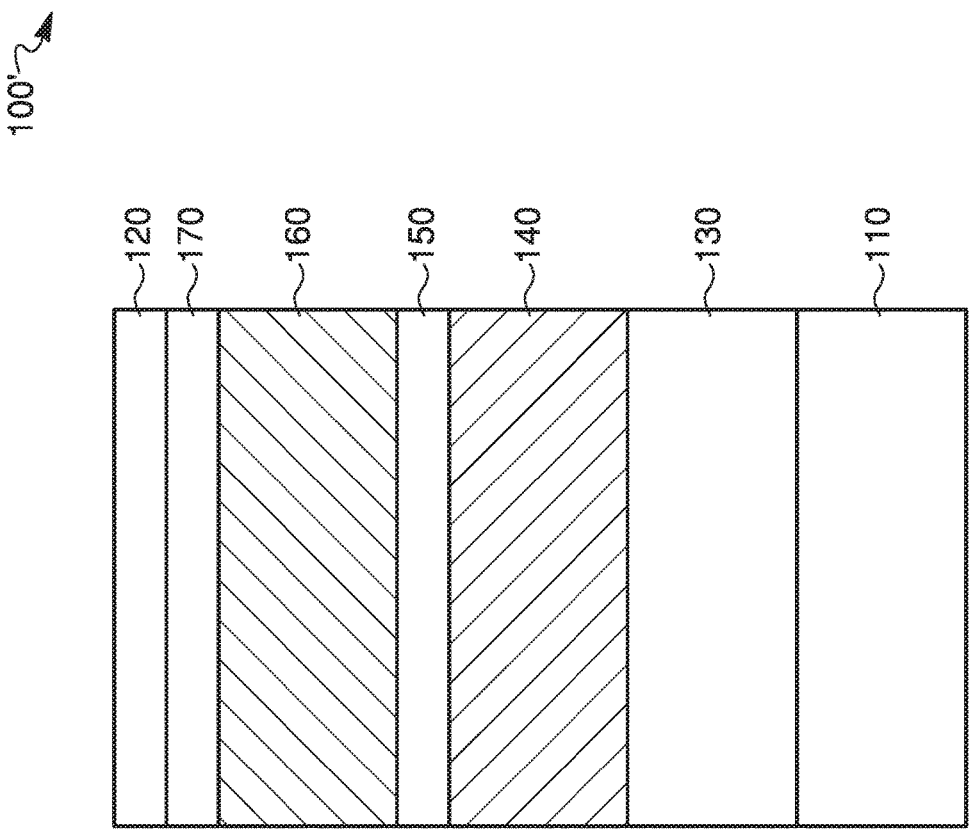
Figure 2A:
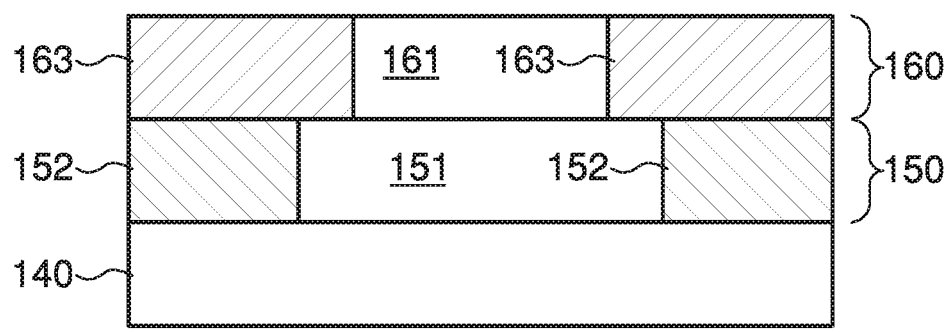
Figure 2B:
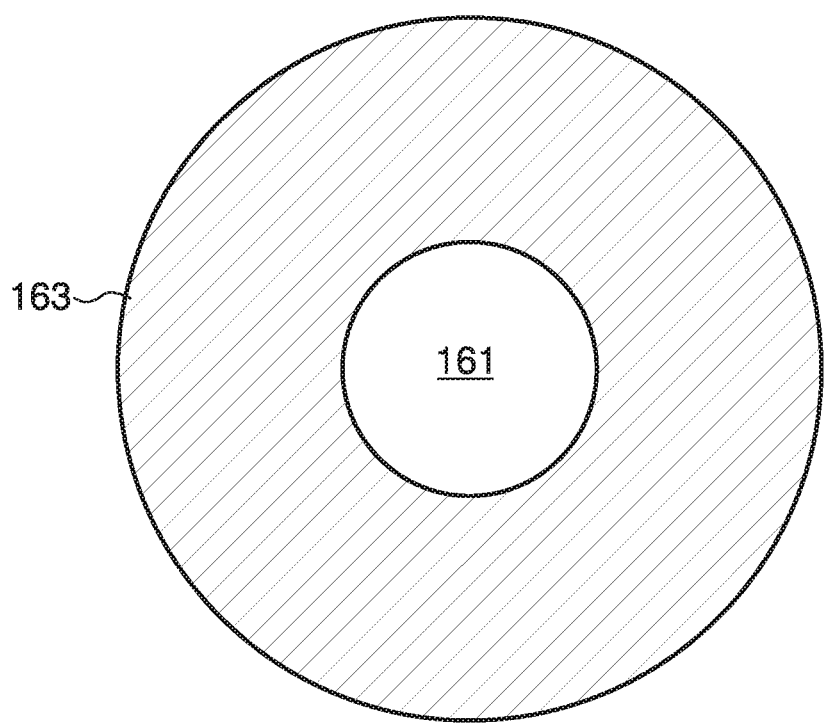
Figure 3A:
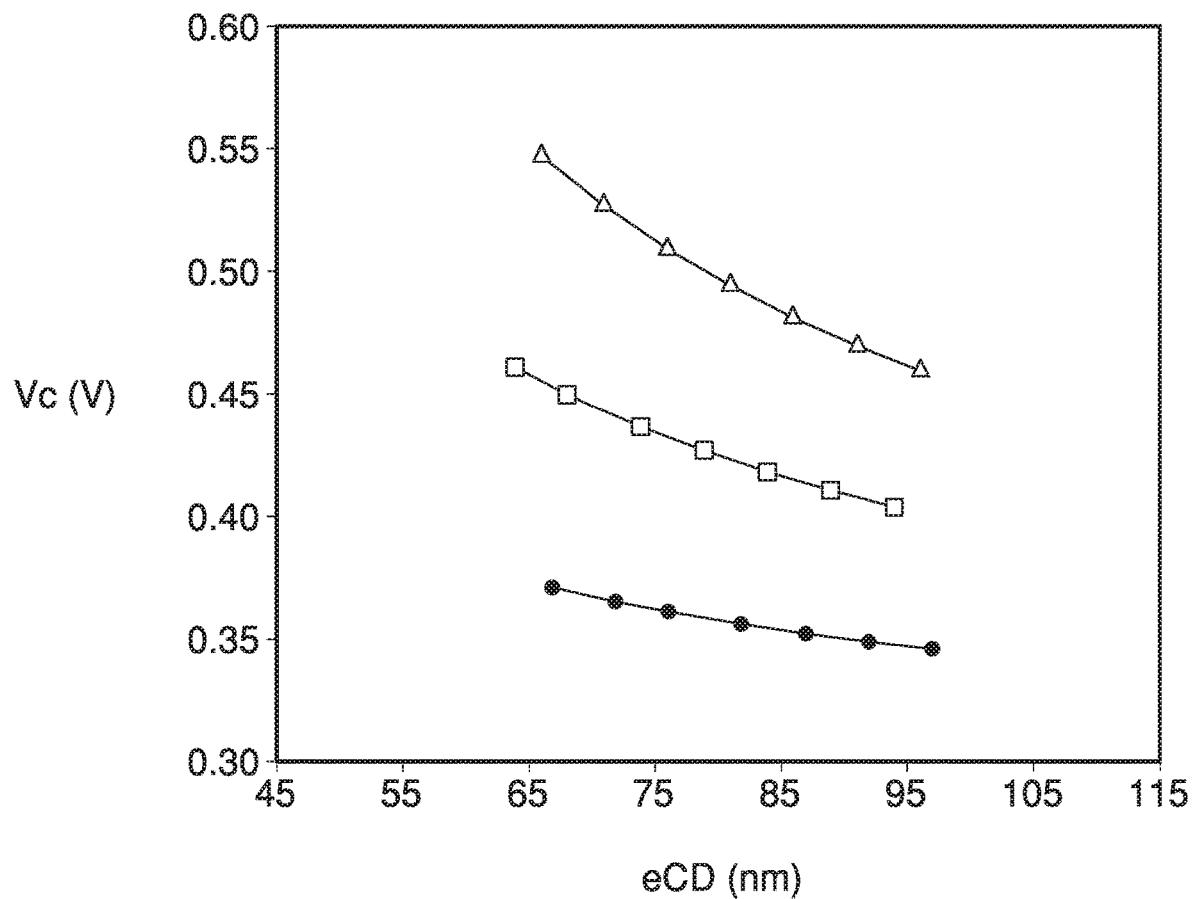
Figure 3B:
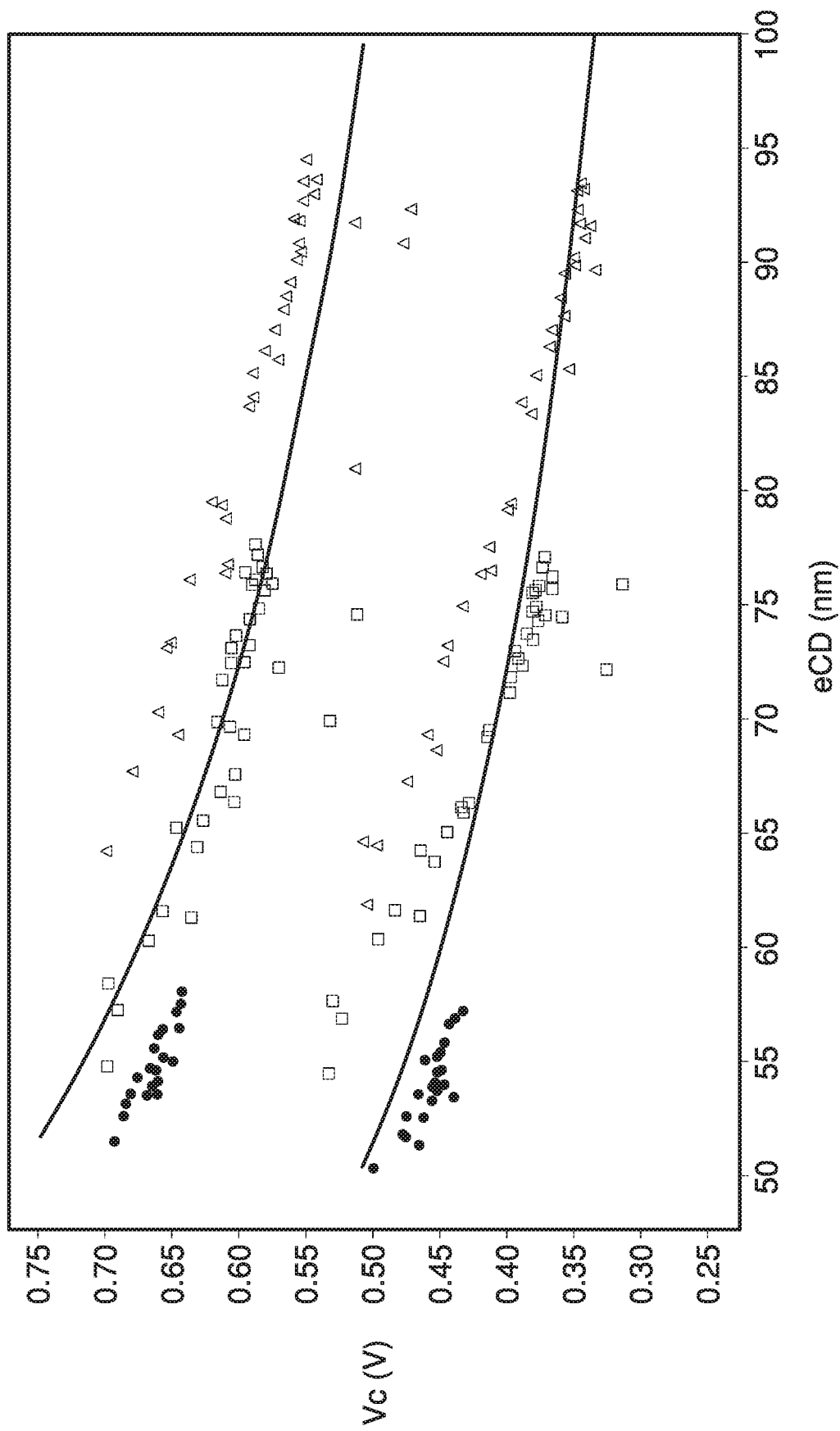
Figure 7:
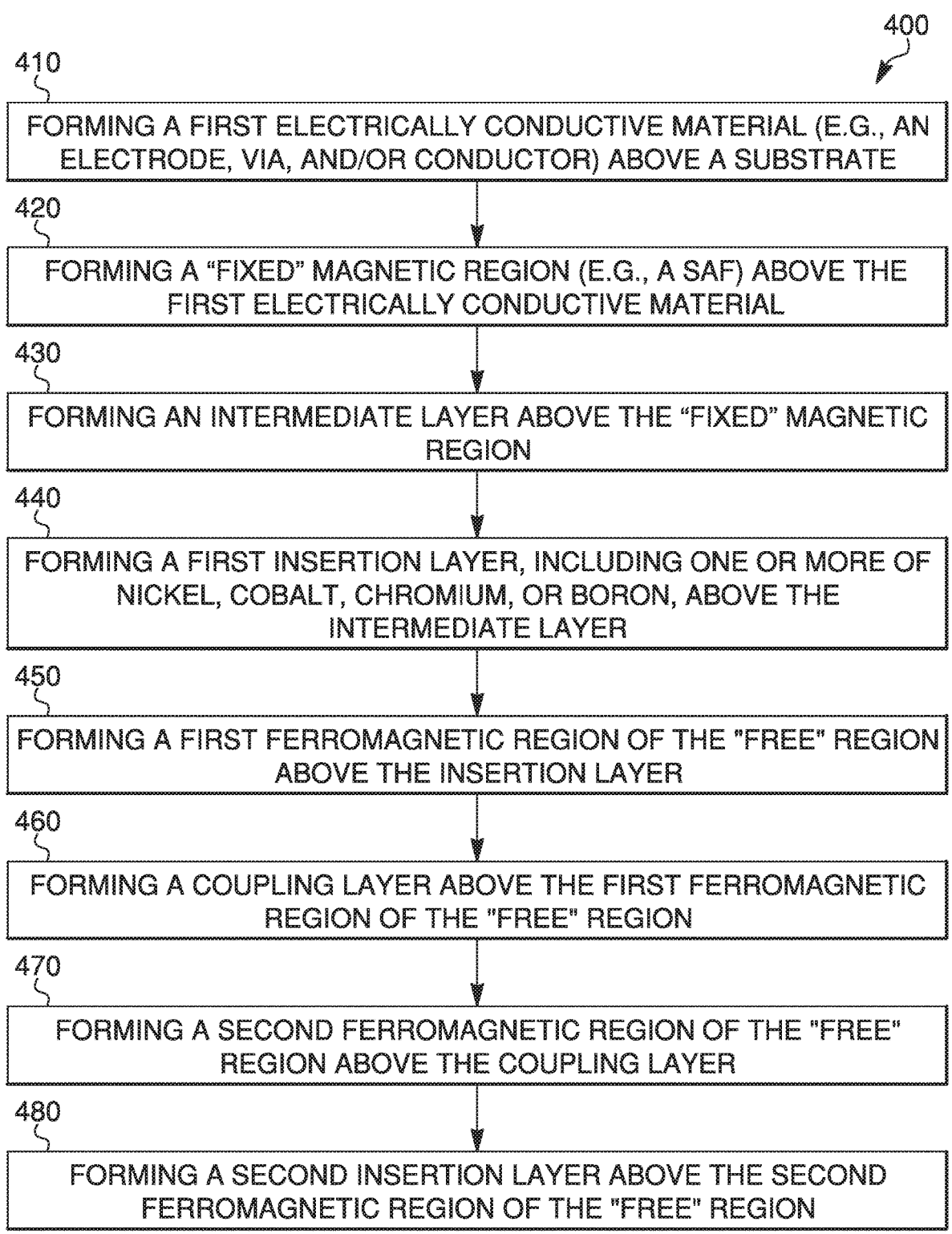
Figure 8:
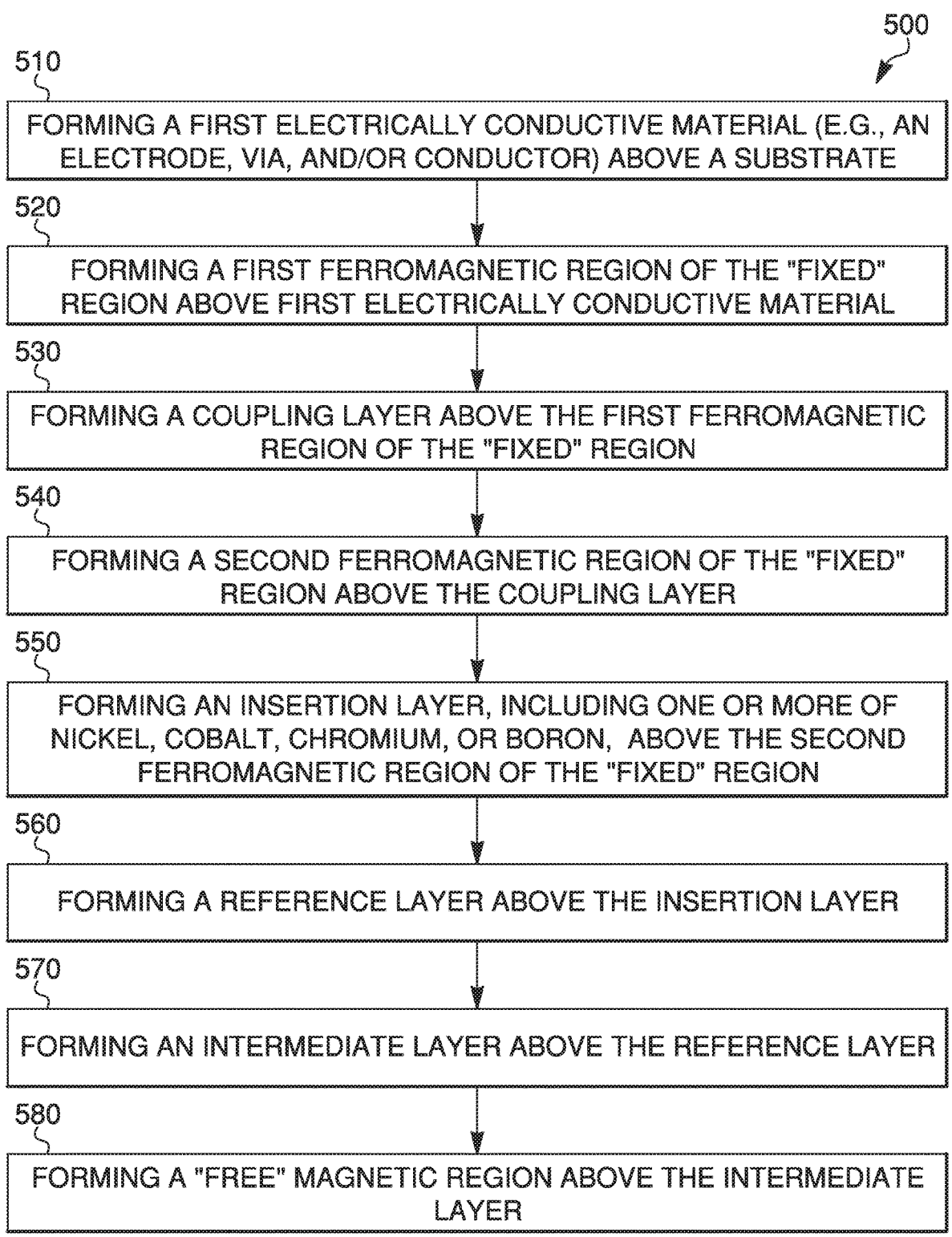
Figure 9B:
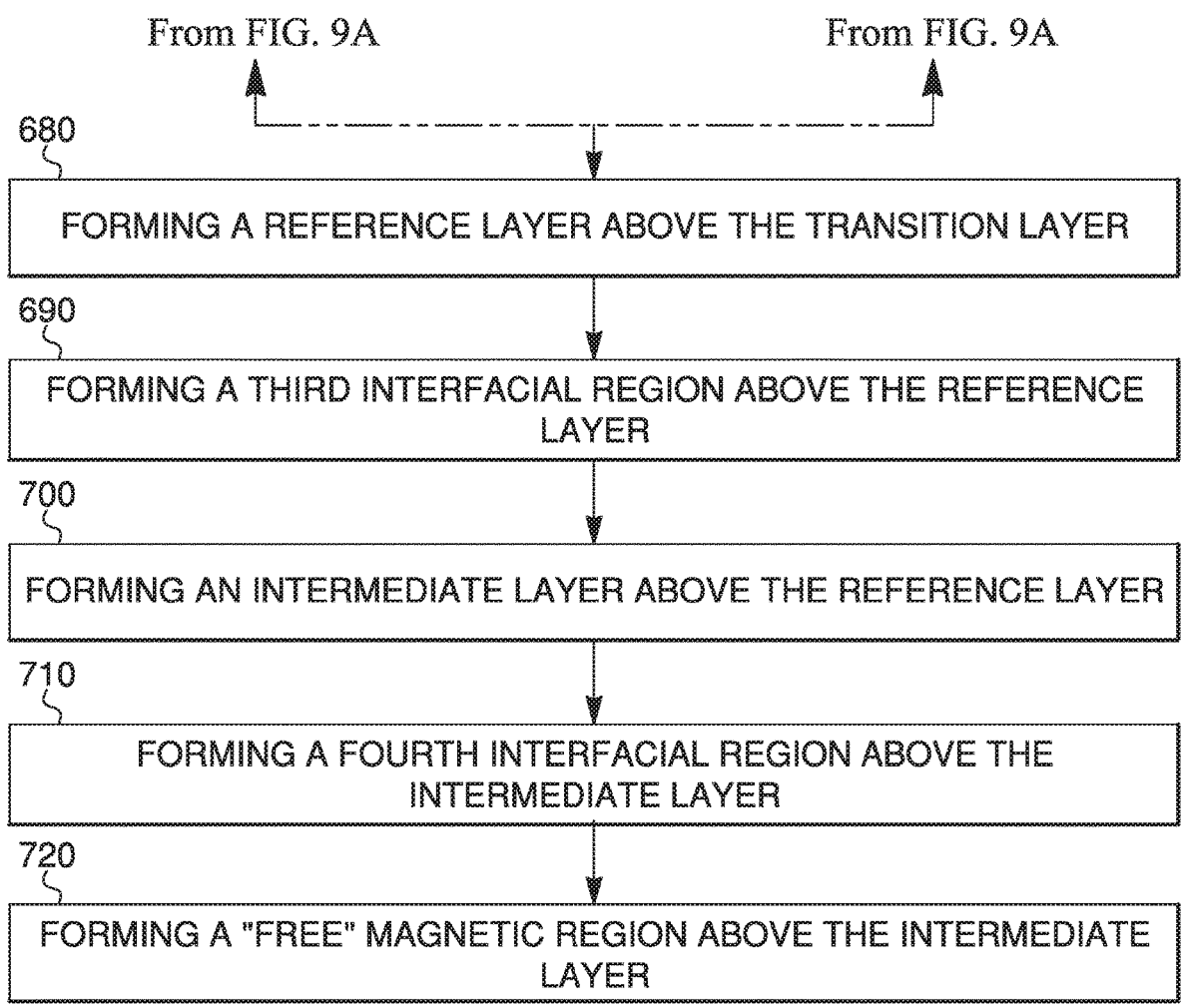
Figure 10:
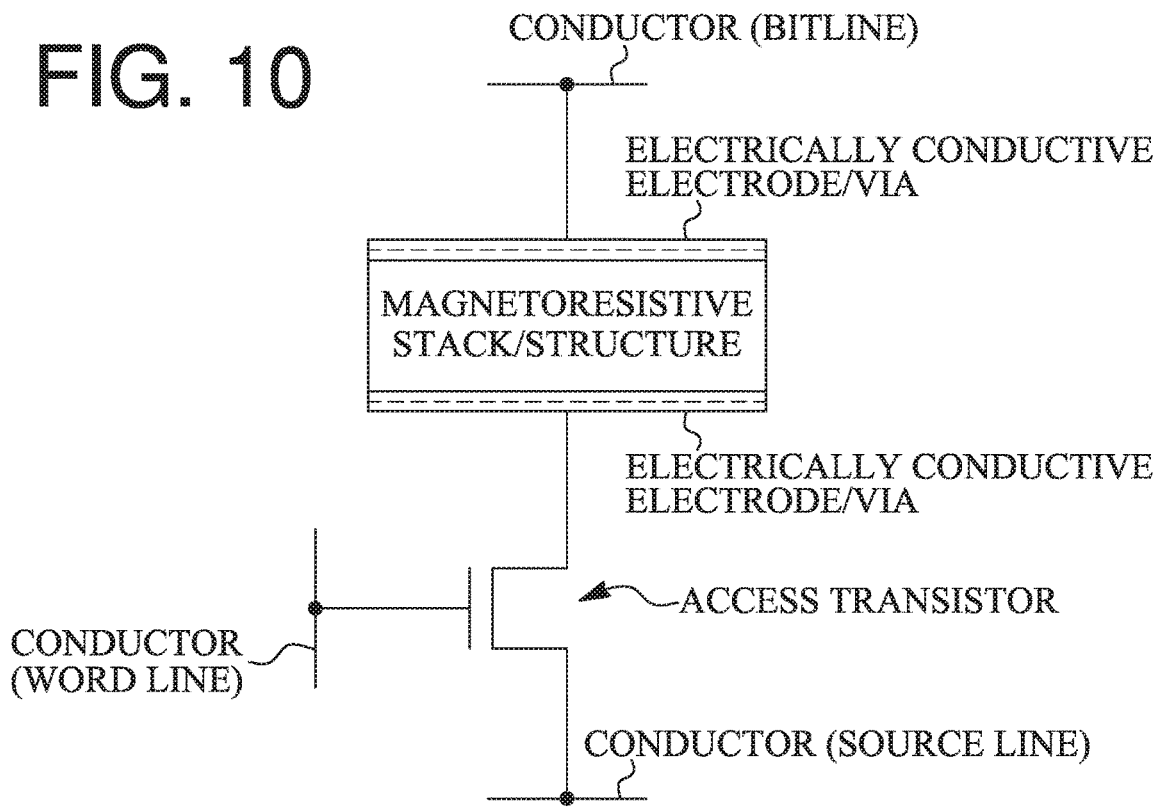
Figure 11A:
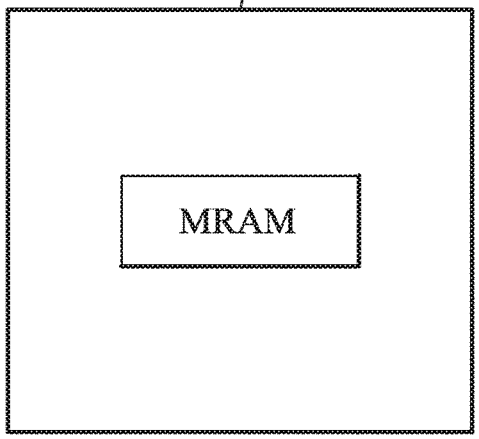
Figure 11B:
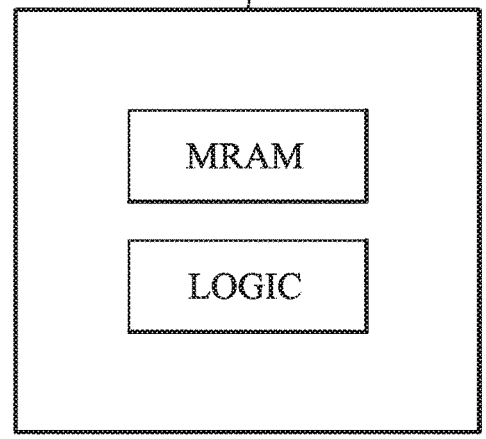
Figure 13A:
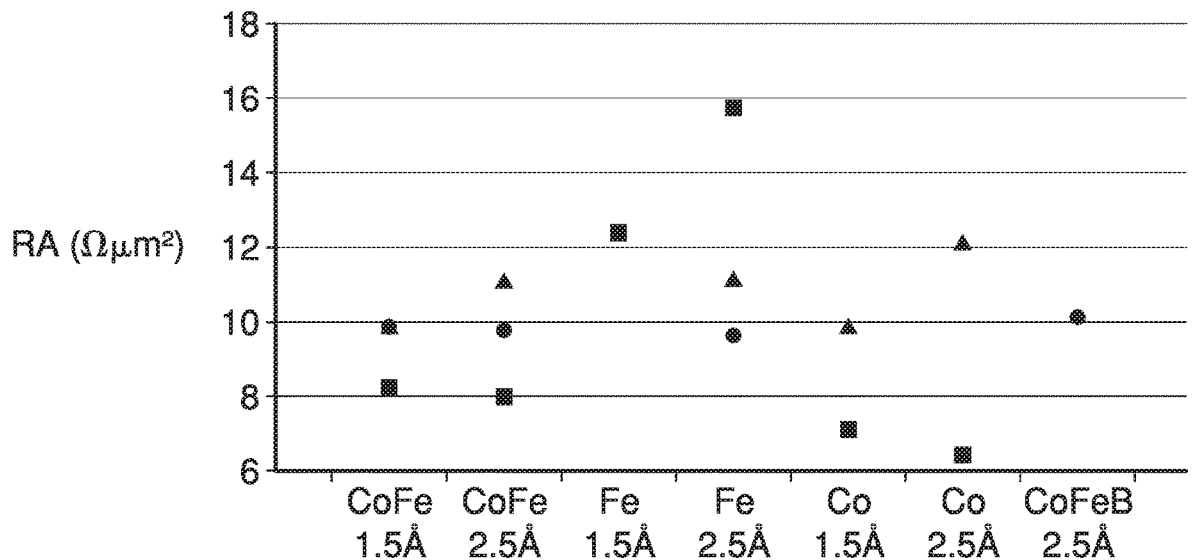
Figure 13B:
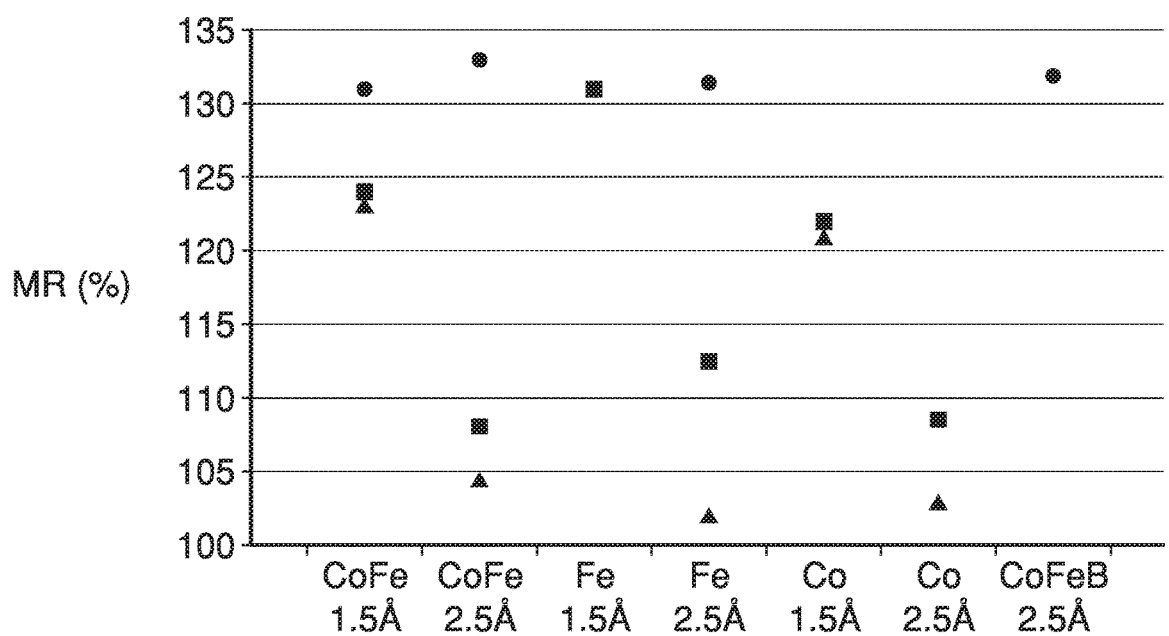

FIGS. 1A and 1B illustrate cross-sectional views depicting various regions of exemplary magnetoresistive stacks, according to one or more embodiments of the present disclosure;

FIGS. 2A and 2B are schematic diagrams of a cross-sectional view (FIG. 2A) and top-down plan view (FIG. 2B) of an exemplary magnetoresistive stack;

FIG. 3A depicts a plot of switching voltage Vc as a function of electrical diameter (eCD) of magnetoresistive stacks, according to aspects of the present disclosure;

FIG. 3B depicts a plot of switching voltage Vc versus electrical diameter (eCD) of magnetoresistive stacks, with best-fit curves fitted according to Equation 3, according to some aspects of the present disclosure;

FIGS. 4A-6B illustrate cross-sectional views depicting various regions of exemplary magnetoresistive stacks, according to one or more embodiments of the present disclosure;

FIG. 7 is a flow chart illustrating an exemplary fabrication process for manufacturing a magnetoresistive device, according to one or more embodiments of the present disclosure;

FIG. 8 is a flow chart illustrating another exemplary fabrication process for manufacturing a magnetoresistive device, according to one or more embodiments of the present disclosure:

FIGS. 9A-9B are a flow chart illustrating another exemplary fabrication process for manufacturing a magnetoresistive device, according to one or more embodiments of the present disclosure;

FIG. 10 is a schematic diagram of an exemplary magnetoresistive memory stack electrically connected to a select device, e.g., an access transistor, in a magnetoresistive memory cell configuration; and FIGS. 11A and 11B are schematic block diagrams of integrated circuits including a discrete memory device and an embedded memory device, each including MRAM (which, in one embodiment is representative of one or more arrays of MRAM having a plurality of magnetoresistive memory stacks, according to aspects of certain embodiments of the present disclosure);

FIGS. 12A-12D are plots of several encroachment measurements made of magnetoresistive structures, according to one or more embodiments of the present disclosure;

FIG. 13A is a plot of several resistance-area product measurements made of magnetoresistive structures, according to one or more embodiments of the present disclosure; and FIG. 13B is a plot of several magnetoresistance measurements made of magnetoresistive structures, according to one or more embodiments of the present disclosure.

Again, there are many embodiments described and illustrated herein. The present disclosure is not limited to any single aspect or embodiment thereof, nor is it limited to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

The present disclosure generally relates to magnetoresistive devices having a magnetoresistive stack or structure (for example, part of a magnetoresistive memory device, magnetoresistive sensor/transducer device, etc.) and methods of manufacturing the described magnetoresistive devices. In one embodiment, an exemplary magnetoresistive stack (for example, one using a magnetic tunnel junction (MTJ)) of the present disclosure may include an insertion layer comprising nickel (Ni), cobalt (Co), or alloys including nickel (Ni) or cobalt (Co) adjacent to or near one or more intermediate layers (e.g., dielectric intermediate layers).

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1 t) to (t+0.1 t) units. Further, all relative terms such as "about," "substantially," "approximately," etc. are used to indicate a possible variation of ±10% (unless noted otherwise or another variation is specified). Moreover, in the claims, values, limits, and/or ranges of thickness and atomic composition of, for example, the described layers/regions, mean the value, limit, and/or range ±10%. It should be noted that the exemplary thickness values discussed in this disclosure are expected values (i.e., not measured values) of layer thicknesses immediately after deposition (based on deposition conditions, etc.). As a person of ordinary skill in the art would recognize, these as-deposited thickness values of a layer or region may change (e.g., by inter-layer diffusion, etc.) after further processing (e.g., exposure to high temperatures, etc.).

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device or method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

It should further be noted that, although exemplary embodiments are described in the context of MTJ stacks/structures, the present inventions may also be implemented in connection with giant magnetoresistive (GMR) stacks/structures where a conductor (e.g., a layer of copper) is disposed between two ferromagnetic regions/layers/materials.

Embodiments of the present disclosure may be employed in connection with other types of magnetoresistive stacks/structures where such stacks/structures include a fixed magnetic region. For the sake of brevity, the discussions and illustrations presented in this disclosure will not be repeated specifically in the context of GMR or other magnetoresistive stacks/structures (e.g., anisotropic magnetoresistive (AMR) devices), but the discussion and drawings described below are to be interpreted as being entirely applicable to GMR and other magnetoresistive stacks/structures (e.g., AMR-type devices).

In this disclosure, the term "region" is used generally to refer to one or more layers. That is, a region (as used herein) may include a single layer (deposit, film, coating, etc.) of material or multiple layers of materials stacked on top of one another (i.e., a multi-layer structure). Further, although in the description below, the different regions and/or layers in the disclosed magnetoresistive devices may be referred to by specific names (e.g., first electrode, second electrode, first intermediate layer, second intermediate layer, fixed region, free region, etc.), this is only for ease of description and not intended as a functional description or relative location/orientation of the layer. Moreover, although the description below and the figures appear to depict a certain orientation of the layers relative to each other, those of ordinary skill in the art will understand that such descriptions and depictions are only exemplary. For example, though a certain first region may be depicted as being "below" a certain second region, in some aspects the entire depicted region may be flipped such that the first region is "above" the second region.

In one aspect, the magnetoresistive devices of the current disclosure include magnetic tunnel junction bits (MTJ bits). These MTJ bits may be formed from a magnetoresistive stack/structure that may include, or may be operably coupled to, one or more electrically conductive electrodes, vias, or conductors on either side of the magnetoresistive stack/structure. As described in greater detail below, the magnetoresistive stack/structure that forms the MTJ bits may include many different regions and/or layers of material, where some of the regions and/or layers include magnetic materials, and whereas other regions and/or layers do not. In at least one embodiments, the methods of manufacturing the disclosed devices may include sequentially depositing, growing, sputtering, evaporating, and/or providing (collectively referred herein as "depositing" or other verb tense (e.g., "deposit" or "deposited")) layers and regions which, after further processing (for example, etching), form an MTJ bit (or a plurality of MTJ bits stacked one on top of another or arranged in an array).

As is known in the art, an electrical resistance of the described MTJ bits may change based on whether the magnetization direction (e.g., the direction of the magnetic moment) of the free region adjacent to the non-magnetic layer (e.g., a dielectric layer serving as a tunnel barrier) is in a parallel alignment or in an antiparallel alignment with the magnetization direction (e.g., the direction of the magnetic moment) of the fixed region adjacent to the non-magnetic layer. Typically, if the two regions have the same magnetization alignment, the resulting relatively low resistance is considered as a digital "0," while, if the alignment is antiparallel, the resulting relatively higher resistance is considered to be a digital "1." A memory device (such as an MRAM) may include multiple such MTJ bits, which may be referred to as memory cells or elements, arranged in an array of columns and rows. By measuring the current through each cell, the resistance of each cell, and thus the data stored in the memory array, can be read.

A magnetoresistive stack may have a critical signal strength or value that may be applied in order to change the magnetic state of the stack (e.g., to change the magnetic state of the stack from a parallel, low-resistance orientation, where the magnetization vectors of a free region and a fixed region are in the same direction, to an antiparallel, high-resistance orientation, where the magnetization vectors of the free region and the fixed region are in opposing directions). Such a signal may be referred to as a write signal. In some embodiments, for example, the write signal may require a threshold switching voltage (Vc) to switch the magnetization vector of the stack. Parts of a magnetoresistive stack (either portions within the same layer and/or region or portions from different regions or layers of the stack) may require different voltages to switch, therefore, the Vc of a magnetoresistive layer, region, or device, may generally be the median of a series of switching voltage measurements.

One or more systems or methods described herein may provide control of switching voltage (Vc) by modifying the organization and/or composition of one or more regions and/or layers of a magnetoresistive stack. Generally, layers including iron (Fe) (e.g., a layer including an alloy comprising iron (Fe) and boron (B)) or a layer with a high-iron content (e.g., layers including with an iron content greater than or equal to 50 atomic percent (at. %)) may be integrated in a magnetoresistive stack to lower the initial switching voltage (Vc) of the stack. In some instances, a layer including iron (Fe) or a high-iron content (e.g., iron interface layers) may be disposed at one or more interfaces of the free region and one or more intermediate layers (e.g., an intermediate layer comprising dielectric material). In other instances, an iron interface layer may be disposed within a fixed region, between a reference layer and a layer of magnetic material. However, as described herein, one or more layers and/or regions including metals such as iron (Fe) may lead to increased encroachment, eventually causing a high Vc, especially as magnetoresistive devices trend towards smaller sizes. One or more embodiments of the present disclosure relate to magnetoresistive stacks/devices with one or more insertion layers including one or more of nickel (Ni), cobalt (Co), chromium (Cr), or boron (B) to control, reduce, or mitigate the effects of encroachment on the magnetoresistive stack/structure. In some embodiments, such an insertion layer may be disposed at one or more interfaces of the free region and one or more intermediate layers (e.g., a dielectric intermediate layer). In one or more embodiments, such an insertion layer may be disposed within a fixed region, between a reference layer and a layer of magnetic material. The inclusion of one or more such insertion layers may provide the constituent magnetoresistive stack with resistance to encroachment and result in a lower Vc relative to magnetoresistive devices including one or more iron interface layers.

For the sake of brevity, conventional techniques related to semiconductor processing may not be described in detail herein. The exemplary embodiments may be fabricated using any suitable now-known or future-developed processes, such as known lithographic processes. The fabrication of integrated circuits, microelectronic devices, micro electro mechanical devices, microfluidic devices, and photonic devices involves the creation of several layers or regions (e.g., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials.

The patterns that define particular regions of devices according to the present disclosure are often created by lithographic processes. For example, a layer of photoresist may be applied onto a layer overlying a wafer substrate. A photo mask (containing clear and opaque areas) may be used to selectively expose the photoresist by a form of radiation, such as ultraviolet light, electrons, or x-rays. Either the photoresist exposed to the radiation, or not exposed to the radiation, may be removed by the application of a developer. An etch may then be employed/applied whereby the layer (or material) not protected by the remaining resist is patterned. Alternatively, an additive process can be used in which a structure is built up using the photoresist as a template.

As noted above, in one aspect, the described embodiments relate to, among other things, methods of manufacturing magnetoresistive devices, such as, e.g., one or more MTJ stacks. As will be described in greater detail below, embodiments of the present disclosure relate to the formation of insertion layers including an alloy including, e.g., nickel (Ni), cobalt (Co), chromium (Cr), and/or boron (B), each of which has a lower standard electric potential than iron (Fe), to allow for the formation of a magnetoresistive stack/structure with suitable resistance to encroachment (e.g., electrical encroachment and/or magnetic encroachment). In some embodiments, the insertion layer may also include iron (Fe). One or more insertion layers may be formed at an interface of an intermediate layer (e.g., a dielectric material disposed between two magnetic regions) and a free magnetic region. In other embodiments, an insertion layer including an alloy including nickel (Ni), cobalt (Co), chromium (Cr), and/or boron (B) may be formed within a fixed magnetic region.

Referring now to FIG. 1A, an exemplary magnetoresistive stack 100 is shown, including a fixed magnetic region 140 and a free magnetic region 160 disposed between a first electrode 110 (e.g., a via or other conductor) and a second electrode 120 (e.g., a via or other conductor). A seed region 130 may be disposed between the first electrode 110 and fixed region 140. Magnetoresistive stack 100 may include an intermediate layer 150 (e.g., of a dielectric material) disposed between the fixed region 140 and the free region 160, and a spacer region 170 between the free region 160 and the second electrode 120.

In some embodiments, a seed region 130 may be formed directly on or above top first electrode 110. The seed region 130 may act as a surface on which one or more layers of a fixed region 140 may be formed (e.g., directly or indirectly) and allows current to pass bidirectionally from the first electrode 110 to the fixed region 140. The seed region 130 may include one or more of nickel (Ni), chromium (Cr), cobalt (Co), iron (Fe), or alloys thereof. In some embodiments, the seed region 130 may include an alloy including nickel (Ni) and chromium (Cr), such as, e.g., a NiCr alloy. The seed region 130 may further include one or more other metals or metal alloys, such as, by way of non-limiting example, palladium (Pd), platinum (Pt), nickel (Ni), tantalum (Ta), ruthenium (Ru), tungsten (W), molybdenum (Mo), iron-boron (FeB), cobalt-iron-boron (CoFeB), tantalum-nitride (TaN), or combinations thereof.

Referring to FIG. 1B, another exemplary magnetoresistive stack 100' is shown, including a first fixed magnetic region 140, a free magnetic region 160, and a second fixed magnetic region 180 disposed between a first electrode 110 (e.g., a via or other conductor) and a second electrode 120 (e.g., a via or other conductor). A seed region 130 may be disposed between the first electrode and the first fixed region 140. Magnetoresistive stack 100' may include a first intermediate layer 150 (e.g., made of a dielectric material) disposed between the first fixed region 140 and the free region 160 and a second intermediate layer 150' (e.g., also made of a dielectric material) above the free region 160. An embodiment including two fixed magnetic regions, such as stack 100', may be referred to more commonly as a dual spin filter (DSF) magnetoresistive stack-structure. In some embodiments, the magnetoresistive stack 100' may optionally include a spacer region (not pictured in FIG. 1B) between the second fixed region 180 and the second electrode 120.

In one or more embodiments, fixed region 140 may be a fixed, unpinned synthetic antiferromagnet (SAF) multilayer structure disposed on seed region 130. The fixed, unpinned SAF multilayer structure may include at least two magnetic regions (e.g., made of one or more layers) separated by a coupling region. The one or more magnetic regions may include nickel (Ni), iron (Fe), and cobalt (Co), palladium (Pd), platinum (Pt), chromium (Cr), manganese (Mn), magnesium (Mg), and alloys or combinations thereof. The coupling region may be an antiferromagnetic coupling region that includes non-ferromagnetic materials such as, for example, iridium (Ir), ruthenium (Ru), rhenium (Re), or rhodium (Rh). In some embodiments, one or more magnetic regions may comprise a magnetic multilayer structure that includes a plurality of layers of a first ferromagnetic material (e.g., cobalt (Co)), a second ferromagnetic material (e.g., nickel (Ni)), and/or a paramagnetic material (e.g., platinum (Pt)).

Additionally, or in the alternative, in some embodiments, the fixed region 140 may include one or more synthetic ferromagnetic structures (SyF). Since SyFs are known to those skilled in the art, they are not described in greater detail herein. In some embodiments. the fixed region 140 may have a thickness of approximately 8 Å to approximately 300 Å. approximately 15 Å to approximately 110 Å, greater than or equal to 8 Å, greater than or equal to 15 Å, less than or equal to 300 Å, or less than or equal to 110 Å.

fixed region 140 may be deposited using any technique now known or later developed. In some embodiments, one or more of the magnetic regions of the fixed region 140 may be deposited using a "heavy" inert gas (e.g., xenon (Xe), argon (Ar), krypton (Kr)), at room temperature, approximately 25° C., approximately 15° C. to approximately 40° C., approximately 20° C. to approximately 30° C. In some embodiments, the coupling region of the SAF may also be deposited using a "heavy" inert gas at similar temperatures. In some embodiments, one or more of the magnetic regions of the fixed region 140 may be deposited using a "heavy" inert gas (e.g., xenon (Xe), argon (Ar), krypton (Kr)), at temperatures greater than approximately 25° C., such as, for example, greater than approximately 150° C.

The various regions or layers of fixed region 140 may be deposited individually during manufacture. However, as would be recognized by those of ordinary skill in the art, the materials that make up the various regions may alloy with (intermix with and/or diffuse into) the materials of adjacent regions during subsequent processing (e.g., deposition of overlying layers, high temperature or reactive etching technique, and/or annealing). Therefore, a person skilled in the art would recognize that, although the different regions of fixed region 140 may appear as separate regions with distinct interfaces immediately after formation of these regions, after subsequent processing operations, the materials of the different layers or regions may alloy together to form a single alloyed fixed region 140 having a higher concentration of different materials at interfaces between different regions. Thus, in some cases, it may be difficult to distinguish the different regions of the fixed region 140 in a finished magnetoresistive stack.

Referring now to FIGS. 2A and 2B, a region of a magnetoresistive structure, including a fixed region 140, an intermediate layer 150, and a free region 160, is shown in a simplified schematic. FIG. 2A shows a cross-sectional side view of the region and FIG. 2B shows a top down plan view of the region. Free region 160 is depicted as having a peripheral portion 163 at and near the circumferential edge of free region 160, and an inner portion 161 surrounded by peripheral portion 163. Similarly, as depicted in FIG. 2A, intermediate layer 150 may include a peripheral portion 152 at and near the circumferential edge of intermediate layer 150, and an inner portion 151 surrounded by peripheral portion 152. The peripheral portion of a layer or region (e.g., peripheral portions 152, 163) may be dominated by somewhat different characteristics (e.g., material and/or electrical characteristics) than the inner portion of the layer or region (e.g. inner portions 151, 161), as described further below. As magnetoresistive devices (e.g. MRAM devices) trend towards smaller bit sizes, the proportion of the volume of the peripheral portion of each layer or region of the stack (e.g., peripheral portions 152, 163) to the volume of inner portion of each layer (e.g., inner portions 151, 161) increases, such that the characteristics of each layer or region as a whole becomes more affected by properties of the layer or region's peripheral portion. Moreover, characteristics of each layer or region may become less consistent due to differences between the layer or region's peripheral and inner portions. This may be particularly true of magnetoresistive stacks having electrical diameters (eCD, i.e., the diameter of the electrical conducting area) of less than or equal to about 1 micron.

Differences in the properties between peripheral portions and inner portions may be caused by encroachment. As used herein, encroachment may refer to electrical encroachment, magnetic encroachment, or both. In some instances, encroachment may result in an increased electrical resistance in the portions of the bit affected by encroachment (e.g., at least a portion of one or more peripheral portions (152, 163). Encroachment may result from manufacturing processes, such as, for example, oxidation due to one or more etching steps used to pattern the magnetoresistive stacks. In some cases, encroachment may be observed as an increase in switching voltage (Vc) (e.g., especially as magnetoresistive devices trend towards smaller sizes), caused by differences in the electrical properties between inner portions (e.g., inner portions 151, 161) and peripheral portions (e.g., peripheral portions 152, 163).

Encroachment, magnetic encroachment in particular, may refer to an effect of damage to the edge of layers or regions in a magnetoresistive stack, for example, during an etch process (e.g., damage to peripheral portion 163 of free region 160, shown in FIGS. 2A-2B). Such damage to a free region 160 of a magnetoresistive stack may result in a lower perpendicular anisotropy field of the free region 160, a lower magnetic moment of free region 160, a higher effective damping of free region 160, and/or a change in exchange stiffness, higher switching voltages (Vc), and lower thermal stability. For example, in a free region 160 with high encroachment, part of inner portion 161 may switch first at a lower voltage, followed by switching of part of peripheral portion 163 of free region 160 at a higher voltage. The overall switching of free region 160 may become more complex and may require a higher energy input.

FIG. 3A depicts a typical correlation between electrical diameter of a stack (etcd) and the switching voltage (Vc) of the stack. For any given magnetoresistive bit (e.g., an MTJ-type bit), the resistance-area product (RA) and switching voltage (Vc) may be measured. The electrical diameter of the bit (eCD) may be calculated, based on the RA and the resistance of the low-resistance state (Rmin) according to Equation 1 (Eq. 1).

$$eCD = 2\sqrt{\frac{RA}{\pi R_{min}}} \qquad (Eq.\ 1)$$

As can be seen in Equation 1, the electrical diameter (eCD) of a bit is equal to two times the square-root of the RA divided by the product of pi and the resistance of the bit ($R_{min}$) in a low-resistance state (e.g., a digital "0" state). The encroachment (E) of a bit may be calculated by subtracting the electrical diameter of a bit (eCD) from the magnetic diameter of the bit (magCD), and dividing by two, where the magnetic diameter of the bit (magCD) (e.g., diameter of the intermediate layer) may be measured by, for example, transmission electron microscopy (TEM). This calculation is shown in Equation 2 (Eq. 2).

$$E = \frac{magCD - eCD}{2} \qquad (Eq.\ 2)$$

Referring again to FIG. 3A, a plot is shown depicting the general relationship between switching current ($V_C$) and the electrical diameter (eCD) of a bit (e.g., a magnetoresistive stack). The top curve (△) represents measurements taken from bits with 12 nm of encroachment, the middle curve (□) represents measurements taken from bits with 8 nm of encroachment, and the bottom curve (○) represents measurements taken from bits with 4 nm of encroachment. As shown in FIG. 3A, the switching current ($V_C$) and electrical diameter (eCD) of a bit are correlated. The relationship between switching current and electrical diameter may be described by Equation 3 (Eq. 3), shown below.

$$V_C = j_C RA \left(\frac{1}{eCD}\right)^2 (eCD + 2E)^2 \qquad (Eq.\ 3)$$

Accordingly, by measuring the resistance-area product (RA) and switching voltage ($V_C$) of a bit, the $V_C$ may be plotted versus the electrical diameter (eCD) (as calculated by Equation 1). After $V_C$ is plotted versus eCD, the plot may be fitted with a curve according to Equation 3, where the curve gives approximate values of the critical current ($j_c$) and the encroachment (E). Therefore, encroachment of a bit (e.g., an MTJ bit), magnetoresistive stack, magnetoresistive structure, or magnetoresistive device may be calculated from a series of RA and switching voltage ($V_C$) measurements.

FIG. 3B shows one exemplary plot of switching voltage ($V_C$) versus electrical diameter (eCD). The trigonal points (△) represent measurements taken from 85 nm bits, the square points (□) represent measurements taken from 70 nm bits, and the circular points (○) represent measurements taken from 55 nm bits. As can be seen in FIG. 3B, two different correlatory curves were measured; these two curves relate to two different switching voltages ($V_C$). The top curve relates to switching the bit from an antiparallel (high-resistance) state to a parallel (low-resistance) state. Conversely, the bottom curve relates to switching the bit from a parallel (low-resistance) state to an antiparallel (high-resistance) state. Both curves fit Equation 3, as the critical current ($j_c$) is dependent on the direction of switching. In the fit lines calculated and plotted in FIG. 3B, the encroachment (E) was estimated to be 14.17 nm.

Various regions, and methods of forming the regions, of exemplary magnetoresistive stacks (e.g., stacks 100, 100') will now be described. In one or more embodiments, an insertion layer including one or more of nickel (Ni), cobalt (Co), ruthenium (Ru), iridium (Ir), and/or boron (B) may be provided. In other embodiments, one or more layers of ferromagnetic material of a free layer may include one or more of nickel (Ni), cobalt (Co), chromium (Cr), ruthenium (Ru), iridium (Ir), and/or boron (B). Further, embodiments of the present disclosure may maintain a low switching voltage (Vc) and exhibit resistance to encroachment. Although various embodiments will be discussed, it should be understood that aspects of one embodiment may be combined with aspects of another embodiment without departing from the intended scope of the present disclosure.

Figure 4A:
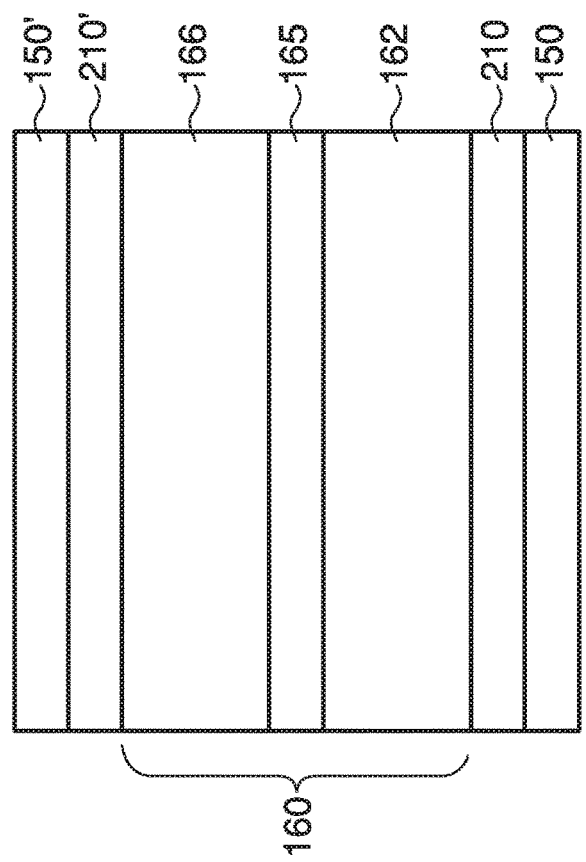
Figure 4B:
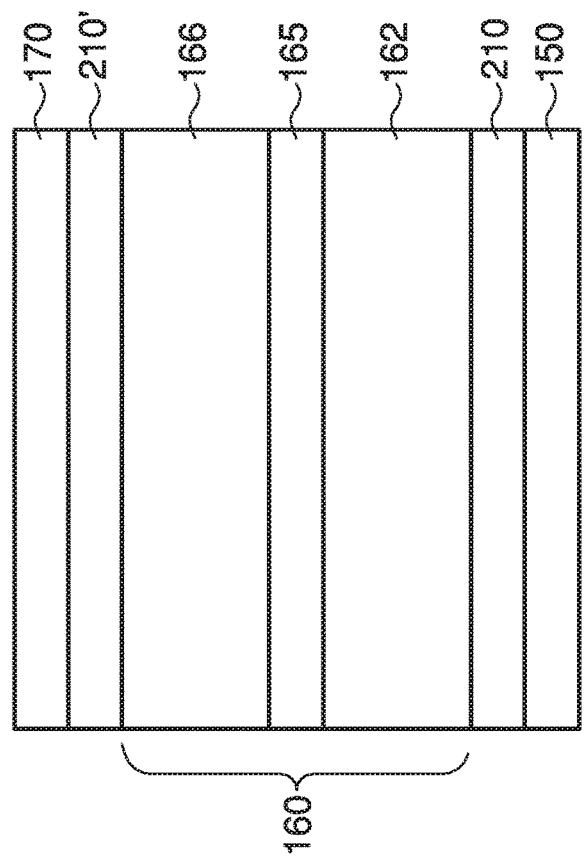

Referring now to FIGS. 4A and 4B, in one or more embodiments, free region 160 may include one or more layers of ferromagnetic material (e.g., first ferromagnetic layer 162 and/or second ferromagnetic layer 166) separated by a coupling region 165 (e.g., including tantalum (Ta), tungsten (W), molybdenum (Mo), ruthenium (Ru), rhodium (Ro), rhenium (Re), iridium (Ir), chromium (Cr), osmium (Os), and combinations thereof). The coupling region 165 may provide either ferromagnetic coupling or antiferromagnetic coupling between the ferromagnetic layers/regions of the free magnetic region 160. Notwithstanding the specific construction of free magnetic region 160, free magnetic region 160 may include a magnetic vector (or moment) that can be moved or switched by applied magnetic fields or spin transfer torque. Free magnetic region 160 may be formed from any ferromagnetic material or alloy having two or more stable magnetic states. Additional elements may be added to the ferromagnetic material or alloy to provide improved magnetic, electrical, or microstructural properties. In some embodiments, free region 160 also may include one or more synthetic anti-ferromagnetic (SAF) or synthetic ferromagnet (SyF) structures. In some embodiments, as depicted in FIG. 4A, a free region 160 may be disposed between an intermediate layer 150 and a top electrode 170. In other embodiments, such as the one shown in FIG. 4B, a free region 160 may be disposed between a first intermediate layer 150 and a second intermediate layer 150'. The layers of free region 160 may be formed by any process described herein, such as, for example, physical vapor deposition (PVD) or chemical vapor deposition (CVD) process known in the art (e.g., sputtering, magneton sputtering, ion beam deposition, atomic layer deposition, evaporative techniques).

One or more insertion layers 210 may be disposed on either side of free region 160. For example, referring to FIG. 4A, a first insertion layer 210 may be disposed between intermediate layer 150 and free region 160. Alternatively or in addition, a second insertion layer 210' may be disposed between free region 160 and top electrode 170. Referring to FIG. 4B, in some embodiments, a first insertion layer 210 may be formed between a first intermediate layer 150 and free region 160 and/or a second insertion layer 210' may be formed between free region 160 and a second intermediate layer 150'.

In some embodiments, the one or more layers of ferromagnetic material (e.g., first ferromagnetic layer 162 and/or second ferromagnetic layer 166) of free region 160 may include nickel (Ni), iron (Fe), cobalt (Co), iridium (Ir), ruthenium (Ru), boron (B), and/or alloys comprising nickel (Ni), iron (Fe), cobalt (Co), iridium (Ir), ruthenium (Ru), and/or boron (B). One or more layers of ferromagnetic material (e.g., first ferromagnetic layer 162 and/or second ferromagnetic layer 166) may include one or more alloys that include iron (Fe), cobalt (Co), or nickel (Ni), and other relatively electronegative elements (e.g., elements with an electronegativity greater than the electronegativity of iron (Fe)). For example, the one or more layers of ferromagnetic material may include one or more alloys, such as, for example, an alloy having the formula XY, where X is selected from a list comprising: cobalt (Co), iron (Fe), nickel (Ni), cobalt-iron (CoFe), iron-nickel (FeNi), and cobalt-nickel (CoNi), and Y is selected from a list comprising: silicon (Si), copper (Cu), rhenium (Re), tin (Sn), boron (B), molybdenum (Mo), ruthenium (Ru), palladium (Pd), osmium (Os), iridium (Ir), rhodium (Rh), platinum (Pt), tungsten (W), and carbon (C). Inclusion in the alloy of one or more elements, that have an electronegativity greater than the electronegativity of iron (Fe) (e.g., silicon (Si), copper (Cu), rhenium (Re), tin (Sn), boron (B), molybdenum (Mo), ruthenium (Ru), palladium (Pd), osmium (Os), iridium (Ir), rhodium (Rh), platinum (Pt), tungsten (W), carbon (C)), into the free region 160 may allow for a longer oxidation time to be used in forming the intermediate layer 150 without oxidation of the one or more layers of ferromagnetic material. The inclusion of such metals that have a greater electronegativity than the electronegativity of iron (Fe) may also facilitate greater stability of the stack during annealing and/or other processing steps The one or more layers of ferromagnetic material (e.g., first ferromagnetic layer 162 and/or second ferromagnetic layer 166) may have a thickness of approximately 10 Å to approximately 40 Å, approximately 20 Å to approximately 30 Å, or approximately 25 Å to approximately 28.5 Å. In such embodiments, the one or more insertion layers 210, 210' may include nickel (Ni), cobalt (Co), boron (B), ruthenium (Ru), iridium (Ir), or a combination thereof.

Insertion layers 210, 210' may further comprise iron (Fe), alloys including cobalt (Co) and iron (Fe), alloys including nickel (Ni) and iron (Fe), and/or alloys including two or more of cobalt (Co), nickel (Ni), iron (Fe), and boron (B).

In some embodiments, an insertion layer 210, 210' may include less than or equal to 50 at. % iron (Fe), less than or equal to 40 at. % iron (Fe), less than or equal to 35 at. % iron (Fe), less than or equal to 30 at. % iron (Fe), less than or equal to 25 at. % iron (Fe), less than or equal to 20 at. % iron (Fe), less than or equal to 15 at. % iron (Fe), less than or equal to 10 at. % iron (Fe), less than or equal to 5 at. % iron (Fe), less than or equal to 3 at. % iron (Fe), or even less than or equal to 1 at. % iron (Fe). In some embodiments, an insertion layer 210, 210' may comprise greater than or equal to 50 at. % cobalt (Co), greater than or equal to 55 at. % cobalt (Co), greater than or equal to 65 at. % cobalt (Co), greater than or equal to 70 at. % cobalt (Co), greater than or equal to 75 at. % cobalt (Co), greater than or equal to 80 at. % cobalt (Co), greater than or equal to 85 at. % cobalt (Co), greater than or equal to 90 at. % cobalt (Co), or greater than or equal to 95 at. % cobalt (Co). In further embodiments, an insertion layer 210, 210' may comprise greater than or equal to 50 at. % nickel (Ni), greater than or equal to 55 at. % nickel (Ni), greater than or equal to 65 at. % nickel (Ni), greater than or equal to 70 at. % nickel (Ni), greater than or equal to 75 at. % nickel (Ni), greater than or equal to 80 at. % nickel (Ni), greater than or equal to 85 at. % nickel (Ni), greater than or equal to 90 at. % nickel (Ni), or greater than or equal to 95 at. % nickel (Ni).

In some embodiments, one or more insertion layers 210, 210' may include a high-iron content layer (e.g., an iron interface layer). In such embodiments, first ferromagnetic layer 162 and/or second ferromagnetic layer 166 may include greater than or equal to 50 at. % of one or more of nickel (Ni), cobalt (Co), ruthenium (Ru), iridium (Ir), or combinations thereof. First ferromagnetic layer 162 and/or second ferromagnetic layer 166 may further include iron (Fe). The iron-content of first ferromagnetic layer 162 and/or second ferromagnetic layer 166 may be less than or equal to approximately 50 at. %, less than or equal to approximately 40 at. %, less than or equal to approximately 35 at. %, less than or equal to approximately 30 at. %, less than or equal to approximately 25 at. %, less than or equal to approximately 20 at. %, less than or equal to approximately 15 at. %, less than or equal to approximately 10 at. %, approximately 5 at. % to approximately 40 at. %, or approximately 15 at. % to approximately 30 at. %. In said embodiments, first ferromagnetic layer 162 may have a thickness of 6 Å to 11 Å, such as, for example, 6.5 Å to 10 Å or 7.5 Å to 9 Å. Further, second ferromagnetic layer 166 may have a thickness of 1.5 Å to 6 Å, such as, for example, 1.5 Å to 4 Å or 2.5 Å to 3.5 Å.

Some embodiments described herein may include one or more interfacial layers. The composition of an interfacial layer may vary on the position or location of the interfacial layer within the described magnetoresistive stacks, and the composition of the layers surrounding the interfacial layer. The inclusion of one or more such interfacial layers may provide the constituent magnetoresistive stack with resistance to encroachment and result in a lower Vc relative to magnetoresistive devices without the one or more interfacial layers. Each interfacial layer may have a thickness of approximately 1 Å to approximately 8 Å, such as for example, less than or equal to approximately 5 Å, approximately 1 Å to approximately 5 Å, approximately 1 Å to approximately 3 Å, or approximately 1.5 Å to approximately 3 Å.

Figure 4C:
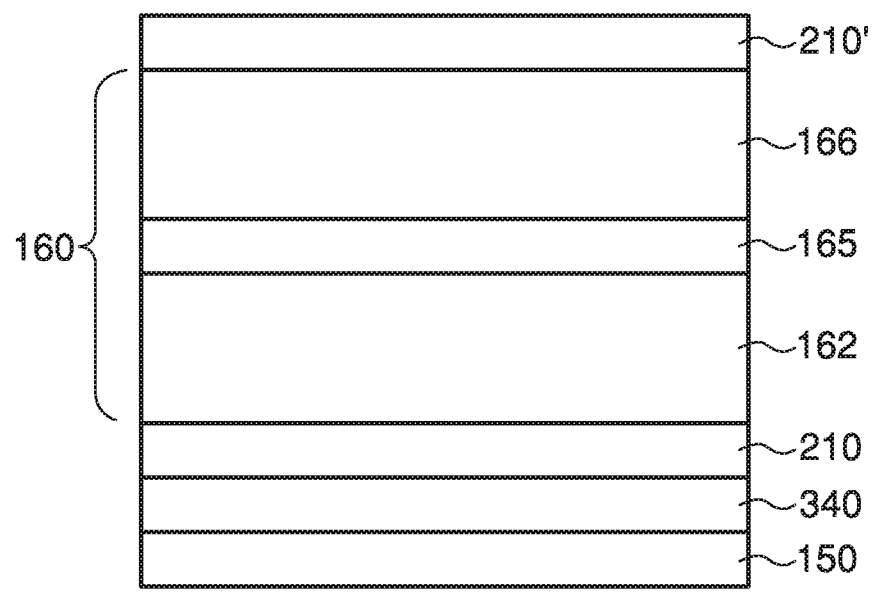
Figure 6B:
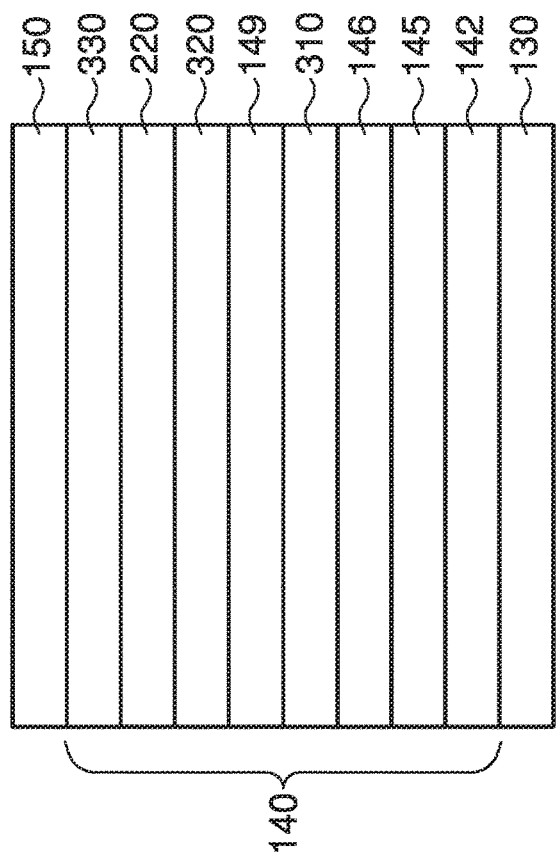

An interfacial layer may be either a crystalline interfacial layer (e.g., interfacial layers 320, 330, 340) or an amorphous interfacial layer (e.g., interfacial layer 310) (see, for example, FIGS. 4C and 6B). A crystalline interfacial layer may have a rigid crystalline structure and may comprise cobalt (Co), iron (Fe), or alloys including cobalt (Co) and iron (Fe) (e.g., cobalt-iron alloy (CoFe)). In some embodiments where a crystalline interfacial layer includes a cobalt-iron alloy (CoFe), the cobalt-iron (CoFe) alloy may have a high cobalt (Co) content (e.g., greater than or equal to 50 at. % cobalt (Co), greater than or equal to 55 at. % cobalt (Co), greater than or equal to 65 at. % cobalt (Co), greater than or equal to 70 at. % cobalt (Co), greater than or equal to 75 at. % cobalt (Co), greater than or equal to 80 at. % cobalt (Co), greater than or equal to 85 at. % cobalt (Co), greater than or equal to 90 at. % cobalt (Co), or greater than or equal to 95 at. % cobalt (Co)). In some embodiments where a crystalline interfacial layer includes a cobalt-iron alloy (CoFe), the cobalt-iron (CoFe) alloy may have a high iron (Fe) content (e.g., greater than or equal to 50 at. % iron (Fe), greater than or equal to 55 at. % iron (Fe), greater than or equal to 65 at. % iron (Fe), greater than or equal to 70 at. % iron (Fe), greater than or equal to 75 at. % iron (Fe), greater than or equal to 80 at. % iron (Fe), greater than or equal to 85 at. % iron (Fe), greater than or equal to 90 at. % iron (Fe), or greater than or equal to 95 at. % iron (Fe)). An amorphous crystalline layer may include amorphous materials that are either cobalt (Co) based or iron (Fe) based. For example, an amorphous interfacial layer may include cobalt-iron-boron (CoFeB) alloys, cobalt-iron-tantalum (CoFeTa) alloys, cobalt-iron-molybdenum (CoFeMo) alloys, and/or cobalt-iron-zirconium (CoFeZr) alloys.

Referring to FIG. 4C, an interfacial layer 340 may be formed above intermediate layer 150 (e.g., an intermediate dielectric layer) and below insertion layer 210. Interfacial layer 340 may be in contact with intermediate layer 150 and/or insertion layer 210. In some embodiments, interfacial layer 340 is a crystalline interfacial layer.

Figure 5B:
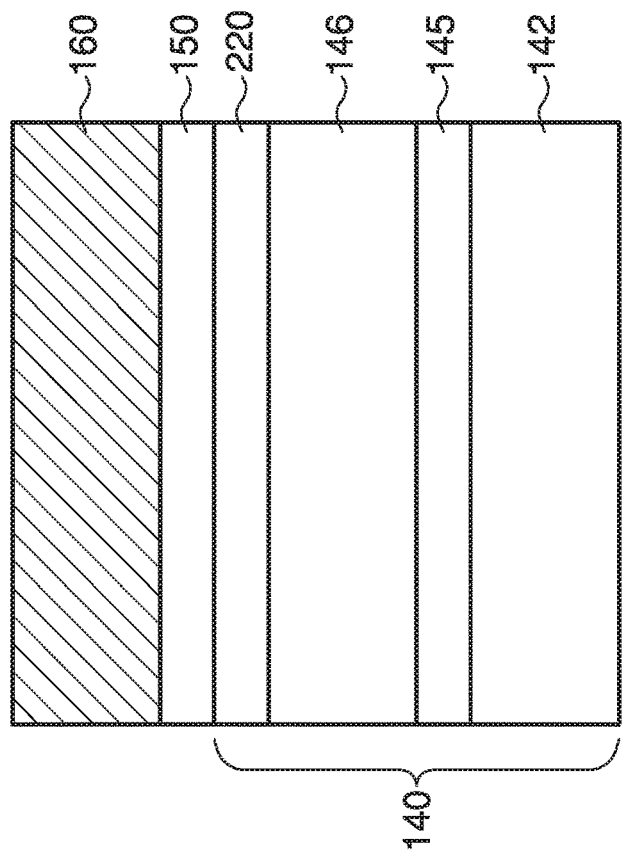
Figure 5A:
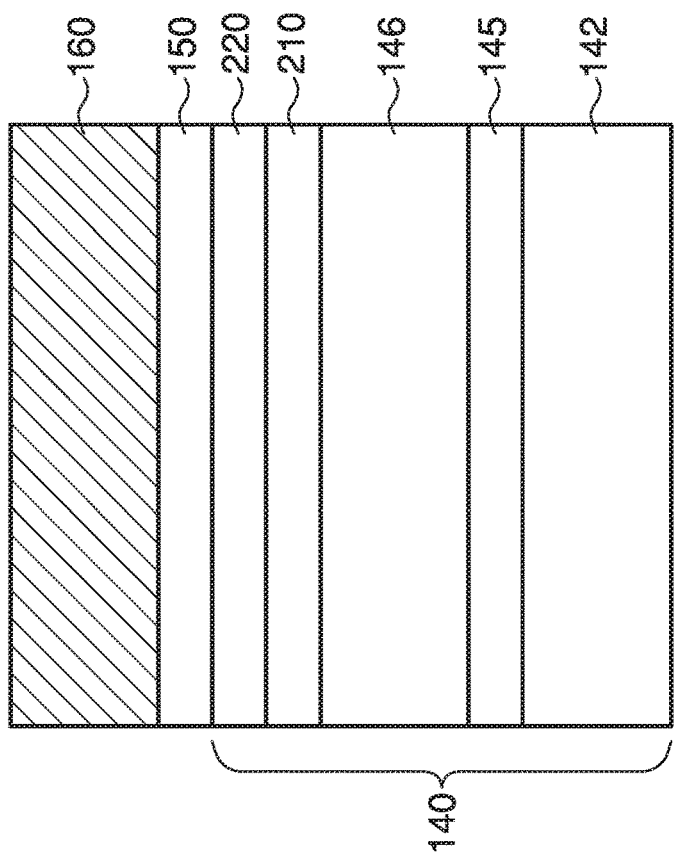

Referring now to FIGS. 5A and 5B, in some embodiments, the fixed region or regions (e.g., fixed regions 140, 180 depicted in FIGS. 1A and 1B) may include one or more layers. While FIGS. 5A and 5B depict only fixed region 140, the aspects of fixed region 140 may also apply to fixed region 180 depicted in FIG. 1B. As depicted in FIGS. 5A and 5B, fixed region 140 may include, or may be disposed adjacent to, one or more additional layers, such as, e.g., an insertion layer 210 and/or a reference layer 220. The insertion layer 210 and/or reference layer 220 may be disposed at the top of fixed region 140, proximate to an overlying layer (e.g., an intermediate layer 150).

Reference layer 220 may include one or more layers of material that, among other things, facilitate and improve the growth of one or more overlying regions during manufacture of magnetoresistive stack 100, 100'. The reference layer 220 may include, e.g., cobalt (Co), iron (Fe), and boron (B), such as a cobalt-iron-boron alloy (CoFeB), a cobalt-iron-boron-tantalum allow (CoFeBTa), a cobalt-iron-tantalum alloy (CoFeTa), or combinations thereof. In some embodiments, reference layer 220 may include one or more alloys that include iron (Fe), cobalt (Co) or nickel (Ni), and other relatively electronegative elements (e.g., elements with an electronegativity greater than the electronegativity of iron (Fe)). For example, the reference layer may include one or more alloys, such as, for example, an alloy having the formula XY, where X is selected from a list comprising: cobalt (Co), iron (Fe), nickel (Ni), cobalt-iron (CoFe), iron-nickel (FeNi), and cobalt-nickel (CoNi), and Y is selected from a list comprising: silicon (Si), copper (Cu), rhenium (Re), tin (Sn), boron (B), molybdenum (Mo), ruthenium (Ru), palladium (Pd), osmium (Os), iridium (Ir), rhodium (Rh), platinum (Pt), tungsten (W), and carbon (C). Inclusion in the alloy of one or more elements, that have an electronegativity greater than the electronegativity of iron (Fe) (e.g., silicon (Si), copper (Cu), rhenium (Re), tin (Sn), boron (B), molybdenum (Mo), ruthenium (Ru), palladium (Pd), osmium (Os), iridium (Ir), rhodium (Rh), platinum (Pt), tungsten (W), carbon (C)), into the reference layer 220 may allow for a longer oxidation time to be used in forming the intermediate layer 150 without oxidation of the fixed region 140. The inclusion of such metals that have a greater electronegativity than the electronegativity of iron (Fe) may also facilitate greater stability of the stack during annealing and/or other processing steps.

In one or more embodiments, a fixed region 140 may include a first magnetic region 142, a coupling layer 145, a second magnetic region 146, an insertion layer 210, and/or a reference layer 220. The first magnetic region 142 may include one or more layers of magnetic or ferromagnetic material. In some embodiments, each layer of magnetic or ferromagnetic material has a thickness less than or equal to approximately 10 Å, less than or equal to approximately 8 Å, less than or equal to approximately 6 Å, less than or equal to approximately 5 Å, less than or equal to approximately 4 Å, less than or equal to approximately 3 Å, or approximately 1 Å to approximately 6 Å.

A coupling layer 145 may be disposed above and/or in contact with the first magnetic region 142. A second magnetic region 146 may be disposed on coupling layer 145. The second magnetic region 146 may have the same composition as the first magnetic region 142, or the second magnetic region 146 may have a different composition than the first magnetic region 142. In some embodiments, a layer of cobalt (Co) is formed on the coupling layer 145 as part of the second magnetic region 146. The coupling layer 145 may be disposed between two cobalt (Co) layers—e.g., between a cobalt layer in first magnetic region 142 and a cobalt layer in second magnetic region 146.

Referring to FIG. 5A, in one or more embodiments, an insertion layer 210, with a composition as previously described (e.g., with respect to insertion layers 210, 210' depicted in FIGS. 4A and 4B), may be disposed adjacent to second magnetic region 146. A reference layer 220 may be adjacent to insertion layer 210. In some embodiments, reference layer 220 may be adjacent to intermediate layer 150. In some embodiments, as shown in FIG. 5B, fixed region 140 may not include an insertion layer 210, and reference layer 220 may be disposed adjacent to second magnetic region 146. Reference layer 220 may include cobalt-iron-boron (CoFeB) or other compositions with a high cobalt (Co) content. For example, reference layer 220 may comprise greater than or equal to approximately 50 at. % cobalt (Co), greater than or equal to approximately 55 at. % cobalt (Co), greater than or equal to approximately 65 at. % cobalt (Co), greater than or equal to approximately 70 at. % cobalt (Co), greater than or equal to approximately 75 at. % cobalt (Co), greater than or equal to approximately 80 at. % cobalt (Co), greater than or equal to approximately 85 at. % cobalt (Co), greater than or equal to approximately 90 at. % cobalt (Co), or greater than or equal to approximately 95 at. % cobalt (Co).

Figure 6A:
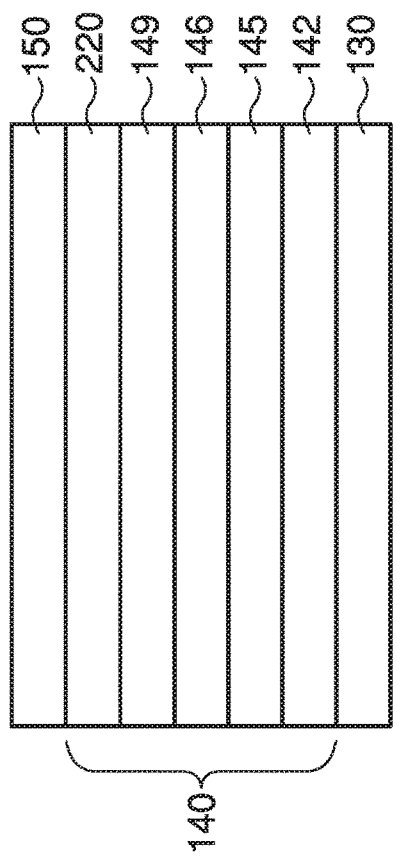

Referring now to FIG. 6A, a fixed magnetic region 140 (e.g., a SAF within fixed magnetic region 140) may include a transition layer 149 disposed above second magnetic region 146 and below reference layer 220. Transition layer 149 may be in contact with second magnetic region 146 and/or reference layer 220. Transition layer 149 may include a non-ferromagnetic transition metal, such as, for example, tantalum (Ta), titanium (Ti), tungsten (W), molybdenum (Mo), or combinations and alloys thereof.

Referring to FIG. 6B, a fixed magnetic region 140 (e.g., a SAF within fixed magnetic region 140) may include one or more interfacial layers. For example, interfacial layer 310 may be disposed between second magnetic region 146 and transition layer 149. Interfacial layer 310 may be in contact with second magnetic region 146 and/or transition layer 149.

In some embodiments, interfacial layer 310 may be an amorphous interfacial layer. In addition, or alternatively, a further interfacial layer 320 may be disposed between transition layer 149 and reference layer 220. Interfacial layer 320 may be in contact with transition layer 149 and/or reference layer 220. Additionally, or alternatively, interfacial layer 330 may be disposed between reference layer 220 and intermediate layer 150 (e.g., a dielectric intermediate layer). Interfacial layer 330 may be in contact with reference layer 220 and/or intermediate layer 150. In some embodiments, interfacial layer 320, interfacial layer 330, or both, are crystalline interfacial layers.

In some embodiments, one or more interfacial layers (e.g., interfacial layer 330 or interfacial layer 340) may include one or more alloys that include iron (Fe), cobalt (Co) or nickel (Ni), and other relatively electronegative elements (e.g., elements with an electronegativity greater than the electronegativity of iron (Fe)). For example, the one or more interfacial layers may include one or more alloys, such as, for example, an alloy having the formula XY, where X is selected from a list comprising: cobalt (Co), iron (Fe), nickel (Ni), cobalt-iron (CoFe), iron-nickel (FeNi), and cobalt-nickel (CoNi), and Y is selected from a list comprising: silicon (Si), copper (Cu), rhenium (Re), tin (Sn), boron (B), molybdenum (Mo), ruthenium (Ru), palladium (Pd), osmium (Os), iridium (Ir), rhodium (Rh), platinum (Pt), tungsten (W), and carbon (C). Inclusion in the alloy of one or more elements, that have an electronegativity greater than the electronegativity of iron (Fe) (e.g., silicon (Si), copper (Cu), rhenium (Re), tin (Sn), boron (B), molybdenum (Mo), ruthenium (Ru), palladium (Pd), osmium (Os), iridium (Ir), rhodium (Rh), platinum (Pt), tungsten (W), carbon (C)), into the interface of an intermediate layer 150 (e.g., a dielectric intermediate layer) may allow for a longer oxidation time to be used in forming the intermediate layer 150 without oxidation of the interfacial layer (e.g., interfacial layer 330 or interfacial layer 340). The inclusion of such metals that have a greater electronegativity than the electronegativity of iron (Fe) may also facilitate greater stability of the stack during annealing and/or other processing steps.

Exemplary methods for forming a magnetoresistive stack 100, 100' according to embodiments of the present disclosure will now be discussed, and reference to parts and the numbered labels shown in FIGS. 1A, 1B and 4A-6B may be made.

FIG. 7 is a flow chart of a method 400 of manufacturing a magnetoresistive stack 100, according to the present disclosure. A first electrically conductive material 110 (e.g., an electrode, via, and/or conductor) may be formed above a substrate, such as, for example, a silicon-based substrate (step 410). A fixed magnetic region (e.g., a SAF) 140 may then be formed above the first electrically conductive material 110 (step 420). A intermediate layer 150 (e.g., a dielectric layer) may be formed above the fixed magnetic region 140 (step 430). An insertion layer 210, (which may, in some embodiments, include one or more of nickel (Ni), cobalt (Co), chromium (Cr), or boron (B)), may be formed above the intermediate layer 150 (step 440). The insertion layer may have any composition described herein. A first ferromagnetic region 162 of free magnetic region 160 may be formed over the insertion layer 210 (step 450). A coupling layer 165 may be formed above the first ferromagnetic region 162 (step 460). A second ferromagnetic region 166 of the free region 160 may be formed above the coupling layer 165 (step 470). A second insertion layer 210', (e.g., including one or more of nickel (Ni), cobalt (Co), chromium (Cr), or boron (B)), may be formed above the second ferromagnetic region 166 (step 480). After the free magnetic region 160 is formed, an optional spacer region may be formed above the free magnetic region 160 in some embodiments. In some embodiments, a second electrically conductive material 120 (e.g., an electrode, via, and/or conductor) may be formed above the spacer region, thereby providing electrical connectivity to magnetoresistive stack 100.

FIG. 8 is a flow chart of another method 500 of manufacturing a magnetoresistive stack 100', according to the present disclosure. A first electrically conductive material 110 (e.g., an electrode, via, and/or conductor) may be formed above a substrate, such as, for example, a silicon-based substrate (step 510). A first ferromagnetic region 142 may be formed above the first electrically conductive material 110 (step 520). A coupling layer 145 may be formed above the first ferromagnetic region 142 (step 530). A second ferromagnetic region 146 may be formed above coupling layer 145 (step 540). An insertion layer 210, (which may, in some embodiments, include one or more of nickel (Ni), cobalt (Co), iron (Fe), or boron (B)), may be formed above the second ferromagnetic region 146 of the fixed region 140 (step 550). A reference layer 220 may be formed above and in contact with insertion layer 210. An intermediate layer 150 (e.g., a dielectric intermediate layer) may be formed above fixed region 140 (step 570). A free magnetic region 160 may be formed above the intermediate layer 150 (step 580). A second fixed magnetic region 180 may then be formed above the second intermediate layer 150'. In some embodiments, an optional spacer region 170 may be formed above the second fixed region 180. A second electrically conductive material 120 (e.g., an electrode, via, and/or conductor) may also be formed, thereby providing electrical connectivity to magnetoresistive stack 100'.

FIGS. 9A-9B are a flow chart of another method 600 of manufacturing a magnetoresistive stack 100, according to the present disclosure. Starting from FIG. 9A, a first electrically conductive material 110 (e.g., an electrode, via, and/or conductor) may be formed above a substrate, such as, for example, a silicon-based substrate (step 610). A first ferromagnetic region 142 may be formed above the first electrically conductive material 110 (step 620). A coupling layer 145 may be formed above the first ferromagnetic region 142 (step 630). A second ferromagnetic region 146 may be formed above coupling layer 145 (step 640). Optionally, a first interfacial layer 310 (e.g., an amorphous interfacial layer), which may, in some embodiments, include one or more of cobalt (Co), iron (Fe), cobalt-iron-boron (CoFeB) alloys, cobalt-iron-tantalum (CoFeTa) alloys, cobalt-iron-molybdenum (CoFeMo) alloys, and/or cobalt-iron-zirconium (CoFeZr) alloys, may be formed above the second ferromagnetic region 146 of the fixed region 140 (step 650). A transition layer 149 may be formed above the second ferromagnetic region 146 (step 660). In embodiments including a first interfacial layer 310, transition layer 149 may be formed above and in contact with first interfacial layer 310. Optionally, a second interfacial layer 320 (e.g., a crystalline interfacial layer), which may, in some embodiments, include cobalt (Co), iron (Fe), or alloys including cobalt (Co) and iron (Fe) (e.g., cobalt-iron alloy (CoFe)), may be formed above and in contact with transition layer 149 (step 670).

The method 600 may further include steps 680-720, as shown in FIG. 9B. A reference layer 220 may be formed above the transition layer 149 (step 680). In embodiments including a second interfacial layer 320, reference layer 220 may be formed above and in contact with second interfacial layer 320. Optionally, a third interfacial layer 330 (e.g., a crystalline interfacial layer), which may, in some embodiments, include cobalt (Co), iron (Fe), or alloys including cobalt (Co) and iron (Fe) (e.g., cobalt-iron alloy (CoFe)), may be formed above and in contact with reference layer 220 (step 690). An intermediate layer 150 (e.g., a dielectric intermediate layer) may be formed above fixed region 140 (e.g., above reference layer 220 and/or above interfacial layer 330 (step 700)). In embodiments including a third interfacial layer 330, intermediate layer 150 may be formed above and in contact with third interfacial layer 330. Optionally, a fourth interfacial layer 340 (e.g., a crystalline interfacial layer), which may, in some embodiments, include cobalt (Co), iron (Fe), or alloys including cobalt (Co) and iron (Fe) (e.g., cobalt-iron alloy (CoFe)), may be formed above and in contact with intermediate layer 150 (step 710). A free magnetic region 160 may be formed above the intermediate layer 150 (step 720). In embodiments including a fourth interfacial layer 340, free magnetic region 160 may be formed above and in contact with fourth interfacial layer 340.

While the steps of methods 400, 500, and 600 have been depicted in a particular order, it is to be understood by those of ordinary skill in the art that such steps may be performed in any suitable order (e.g., in reverse order). Additionally, steps may be repeated, added, or omitted according to techniques known in the art. In some embodiments, such as the one shown in FIG. 1B, a second intermediate layer 150' may be formed above and in contact with free magnetic region 160. In such embodiments, a second fixed magnetic region 180 may then be formed above the second intermediate layer 150'. In some embodiments, an optional spacer region 170 may be formed above the second fixed region 180. In embodiments including a second intermediate layer 150', a second electrically conductive material 120 (e.g., an electrode, via, and/or conductor) may also be formed above spacer region 170, thereby providing electrical connectivity to magnetoresistive stack 100'.

Since suitable integrated circuit fabrication techniques (e.g., deposition, sputtering, evaporation, plating, etc.) that may be used to form the different regions are known to those of ordinary skill in the art, they are not described here in great detail. It should be noted that while not specifically described, various deposition processes (e.g., any physical vapor deposition (PVD) or chemical vapor deposition (CVD) process known in the art, such as sputtering, magneton sputtering, ion beam deposition, atomic layer deposition, evaporative techniques, etc.) may be used to form the various layers of the exemplary magnetoresistive stacks. Further, various lithographic processes, etching processes, or finishing steps common in the art (e.g., ion beam etching, chemical etching, chemical-physical planarization) may be performed after the formation of one or more layers of the exemplary magnetoresistive stacks.

In some embodiments, forming some of the regions may involve thin-film deposition processes, including, but not limited to, physical vapor deposition techniques such as ion beam sputtering and magnetron sputtering. Forming thin insulating layers may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment. In some embodiments, formation of some or all of the regions of a magnetoresistive stack may also involve known processing steps such as, for example, selective deposition, photolithography processing, etching, etc., in accordance with any of the various conventional techniques known in the semiconductor industry.

In some embodiments, during deposition of the disclosed fixed and free regions, a magnetic field may be provided to set a preferred easy magnetization axis of the region (e.g., via induced anisotropy). Similarly, a strong magnetic field applied during the post-deposition high-temperature anneal step may be used to induce a preferred easy magnetization axis and a preferred pinning direction for any antiferromagnetically pinned materials. Additionally, deposition of fixed and free regions may occur in a variety of orders. For example, in some cases, a fixed or antiferromagnetic region may be formed before a free region in a bottom-pinned arrangement, and in other cases, the free region may be formed first on, e.g., a seeding layer, with the fixed region formed above the free region in a top-pinned arrangement.

As alluded to above, the magnetoresistive devices of the present disclosure, including insertion layers 210 and/or one or more interfacial layers 310, 320, 330, 340 described herein, may be implemented in a sensor architecture or a memory architecture (among other architectures). For example, in a memory configuration, the magnetoresistive devices, including embodiment magnetoresistive stacks 100, 100' described herein, may be electrically connected to an access transistor and configured to couple or connect to various conductors, which may carry one or more control signals, as shown in FIG. 10. The magnetoresistive devices of the current disclosure may be used in any suitable application, including, e.g., in a memory configuration. In such instances, the magnetoresistive devices may be formed as an integrated circuit comprising a discrete memory device (e.g., as shown in FIG. 11A) or an embedded memory device having a logic therein (e.g., as shown in FIG. 11B), each including MRAM, which, in one embodiment is representative of one or more arrays of MRAM having a plurality of magnetoresistive stacks, according to certain aspects of certain embodiments disclosed herein.

Figure 12A:
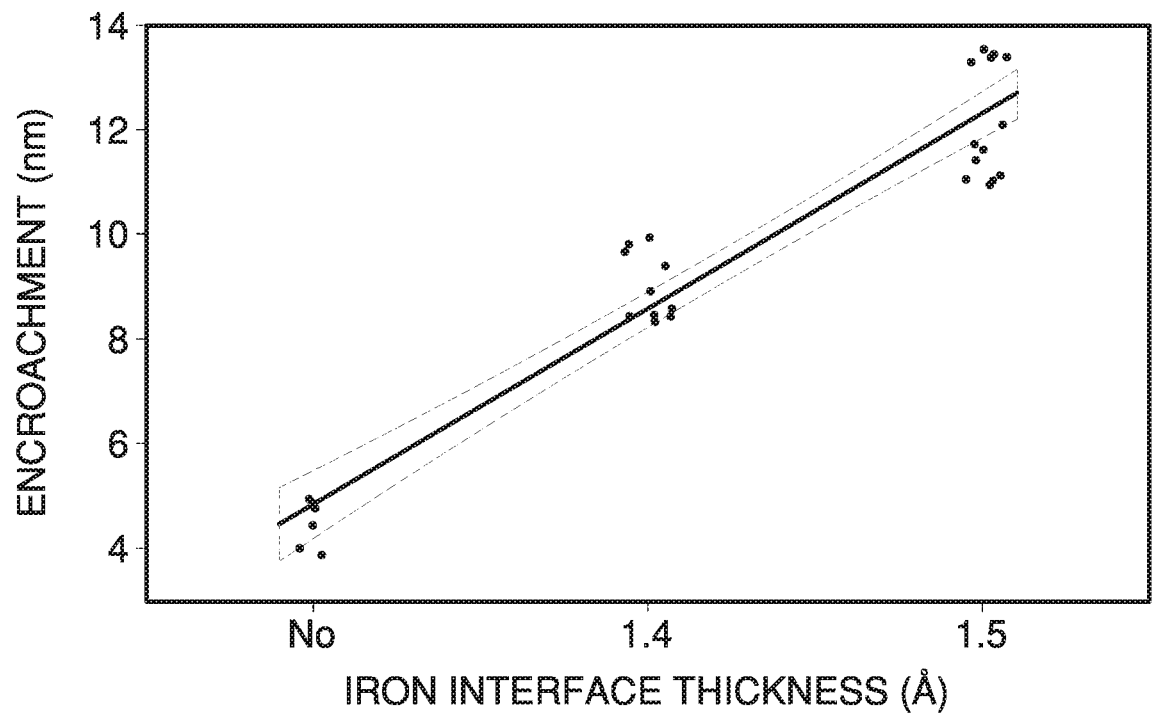

As described herein, encroachment of a magnetoresistive bit may be caused by manufacturing processes, such as, for example, one or more etching steps used to pattern the magnetoresistive stacks. The presence of iron (Fe) or alloys including iron (Fe) and boron (B) at the interface of one or more intermediate layers 150, 150' (e.g., iron interface layers) may lead to such encroachment of the magnetoresistive stack. The encroachment of several magnetoresistive stack structures with varying thickness of high-iron interface layers were measured. In one example, the encroachment of magnetoresistive stacks with a 1.5 Å thick iron interface layer (at the interface of free region 160 and first intermediate layer 150) and magnetoresistive stacks with a 1.4 Å thick iron interface layer (at the interface of free region 160 and first intermediate layer 150) were compared with the encroachment of a magnetoresistive stack not having an iron interface layer. A plot of these encroachment measurements is shown in FIG. 12A. The stacks with the thicker interface layer showed the most encroachment, and the stacks with a thinner high-iron interface layer showed less encroachment. The magnetoresistive stacks without the iron interface layer showed the least encroachment.

Figure 12B:
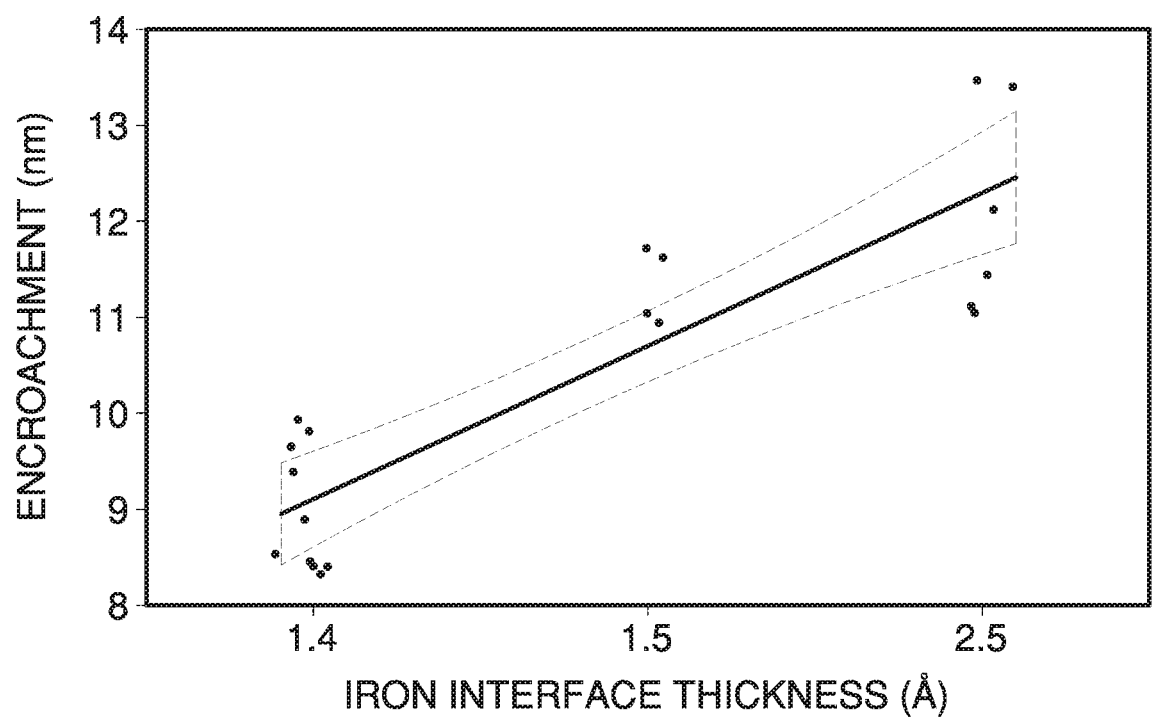

In another example, the encroachment of magnetoresistive stacks with a 2.5 Å thick iron interface layer (at the interface of free region 160 and second intermediate layer 150'), magnetoresistive stacks with a 1.5 Å thick iron interface layer (at the interface of free region 160 and second intermediate layer 150'), and magnetoresistive stacks with a 1.4 Å thick iron interface layer (at the interface of free region 160 and second intermediate layer 150') were measured and compared. A plot of these encroachment measurements is shown in FIG. 12B. The stacks with the thickest interface layer showed the most encroachment, and the stacks with a thinner iron interface layer showed less encroachment, with the magnetoresistive stacks having a 1.4 Å thick iron interface layer (at the interface of free region 160 and second intermediate layer 150') showing the least encroachment.

Figure 12C:
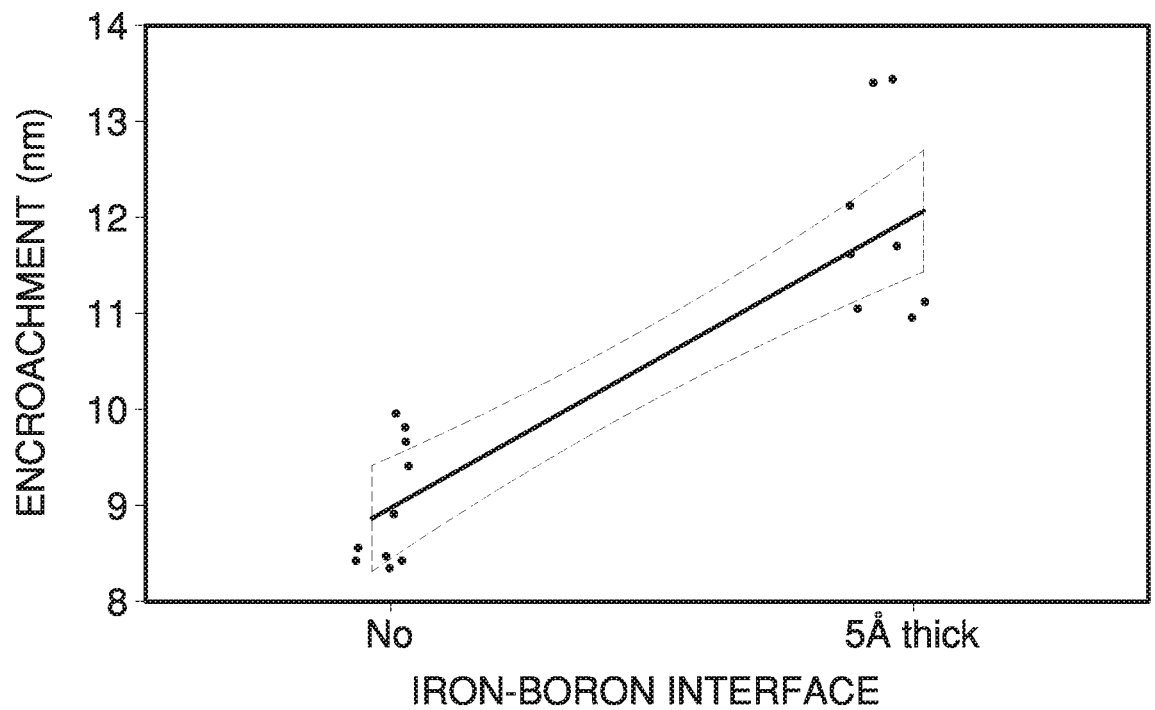

In a further example, the encroachment of magnetoresistive stacks with a 5 Å thick iron-boron (FeB) interface layer (at the interface of free region 160 and first intermediate layer 150) was measured and compared to the encroachment of magnetoresistive stacks without an iron-boron (FeB) interface layer. A plot of these encroachment measurements is shown in FIG. 12C. The stacks without the iron-boron layer at the interface of free region 160 and first intermediate layer 150 showed less encroachment than the magnetoresistive stacks with the iron-boron (FeB) interface layer.

Figure 12D:
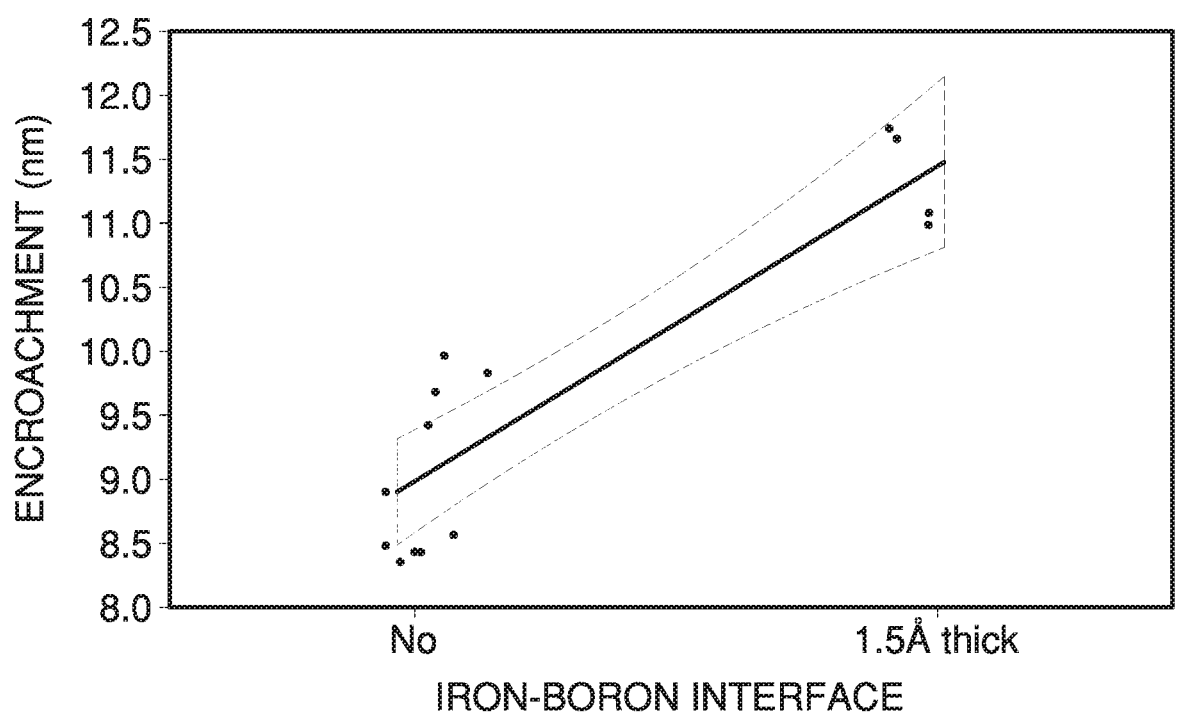

In another example, the encroachment of magnetoresistive stacks with a 1.5 Å thick iron-boron (FeB) interface layer (at the interface of free region 160 and second intermediate layer 150') was measured and compared to the encroachment of magnetoresistive stacks without an iron-boron (FeB) interface layer. A plot of these encroachment measurements is shown in FIG. 12D. The stacks without the iron-boron layer at the interface of free region 160 and second intermediate layer 150' showed less encroachment than the magnetoresistive stacks with the iron-boron (FeB) interface layer.

As described previously, the presence of one or more interfacial layers 310, 320, 330, 340 may lead to less encroachment (e.g., during one or more fabrication processes, such as, e.g., etching) of magnetoresistive stacks as compared to magnetoresistive stacks without one or more interfacial layers. More particularly, it is believed that the above-described interfacial layers 310, 320, 330, 340 may permit increased oxidation doses during formation of intermediate layer 150. The increased oxidation dose may lead to a reduction in short occurring during MTJ stack fabrication and MTJ bits patterning process, such as, e.g., partial and hard shorts. As shown in FIG. 13A, the resistance-area product of several exemplary magnetoresistive stacks was measured. As previously described, a higher resistance-area product of a magnetoresistive stack with Fe at interface of intermediate layer is generally correlated with more encroachment within the stack. The X-axis describes several compositions of interfacial layers and the shape of the marker above each interfacial layer composition describes where the interfacial layer is located. Circle markers (○) indicate that the composition was located at the location of the above-described interfacial layer 310, triangle markers (Δ) indicate that the composition was located at the location of the above-described interfacial layer 320, and square markers (□) indicate the composition was located at the location of the above-described interfacial layer 330. The Y-axis represents measurements of resistance-area product (RA) in units of ohm-square microns ($\Omega\mu m^2$).

The magnetoresistance of several exemplary magnetoresistive stacks was also measured, as shown in FIG. 13B. The X-axis describes several compositions of interfacial layers and the shape of the marker above each interfacial layer composition describes where the interfacial layer is located. Circle markers (○) indicate that the composition was located at the location of the above-described interfacial layer 310, triangle markers (Δ) indicate that the composition was located at the location of the above-described interfacial layer 320, and square markers (□) indicate that the composition was located at the location of the above-described interfacial layer 330. The Y-axis represents measurements of MR in units of percent (%).

Although various embodiments of the present disclosure have been illustrated and described in detail, it will be readily apparent to those skilled in the art that various modifications may be made without departing from the present disclosure.

What is claimed is:

1. A magnetoresistive stack, comprising:
   a fixed magnetic region, wherein the fixed magnetic region includes:
      a first ferromagnetic region;
      a coupling layer disposed on and in contact with the first ferromagnetic region;
      a second ferromagnetic region disposed on and in contact with the coupling layer;
      a transition layer disposed above the second ferromagnetic region;
      a reference layer disposed above the transition layer; and
      at least one interfacial layer disposed above the second ferromagnetic region;
   one or more dielectric layers disposed on and in contact with the fixed magnetic region; and
   a free magnetic region disposed above the one or more dielectric layers.

2. The magnetoresistive stack of claim 1, wherein the at least one interfacial layer comprises cobalt (Co), iron (Fe), or an alloy including cobalt (Co) and iron (Fe).

3. The magnetoresistive stack of claim 1, wherein the at least one interfacial layer includes;
   a first interfacial layer, disposed between the second ferromagnetic region and the transition layer;
   a second interfacial layer, disposed between the transition layer and the reference layer; and
   a third interfacial layer, disposed between the reference layer and the one or more dielectric layers.

4. The magnetoresistive stack of claim 3, wherein the first interfacial layer is amorphous and the second and third interfacial layers are crystalline.

5. The magnetoresistive stack of claim 3, wherein one or more of the third interfacial layer, reference layer, and free magnetic region, comprise an alloy that includes silicon (Si), copper (Cu), rhenium (Re), tin (Sn), boron (B), molybdenum (Mo), ruthenium (Ru), palladium (Pd), osmium (Os), iridium (Ir), rhodium (Rh), platinum (Pt), tungsten (W), carbon (C), or a combination thereof.

6. The magnetoresistive stack of claim 1, wherein each interfacial layer of the at least one interfacial layer has a thickness of approximately 1 Å to approximately 8 Å.

7. The magnetoresistive stack of claim 1, wherein the at least one interfacial layer includes:
   an interfacial layer disposed between the second ferromagnetic region and the transition layer;
   an interfacial layer disposed between the transition layer and the reference layer; or
   an interfacial layer disposed between the reference layer and the one or more dielectric layers.

8. The magnetoresistive stack of claim 1, wherein the at least one interfacial layer includes at least two interfacial layers and the at least two interfacial layers include at least one crystalline interfacial layer and at least one amorphous interfacial layer.

9. The magnetoresistive stack of claim 1, wherein the fixed region is disposed on a seed region.

10. A magnetoresistive stack, comprising:
    a fixed magnetic region, wherein the fixed magnetic region includes:
       a first ferromagnetic region;
       a coupling layer disposed on and in contact with the first ferromagnetic region; and
       a second ferromagnetic region disposed on and in contact with the coupling layer;
    at least one dielectric layer disposed on and in contact with the fixed magnetic region;
    an interfacial layer disposed on and in contact with the at least one dielectric layer; and
    a free magnetic region disposed above the interfacial layer.

11. The stack of claim 10, wherein the at least one dielectric layer is a first dielectric layer, and the stack further comprises a second dielectric layer disposed above the free magnetic region.

12. The stack of claim 10, wherein the interfacial layer disposed on and in contact with the at least one dielectric layer is a first interfacial layer and the fixed magnetic region further includes:
    a transition layer disposed above the second ferromagnetic region;
    a reference layer disposed above the transition layer; and
    at least one interfacial layer disposed above the second ferromagnetic region.

13. The stack of claim 10, further comprising at least one insertion layer disposed above the interfacial layer.

14. The stack of claim 10, wherein the interfacial layer disposed on and in contact with the at least one dielectric layer is a crystalline interfacial layer.

15. The stack of claim 10, wherein the interfacial layer disposed on and in contact with the at least one dielectric layer, the free magnetic region, or both, comprises an alloy that includes silicon (Si), copper (Cu), rhenium (Re), tin (Sn), boron (B), molybdenum (Mo), ruthenium (Ru), palladium (Pd), osmium (Os), iridium (Ir), rhodium (Rh), platinum (Pt), tungsten (W), carbon (C), or a combination thereof.

16. The stack of claim 10, wherein the interfacial layer has a thickness of approximately 1 Å to approximately 8 Å.

17. A magnetoresistive stack, comprising:
    a fixed magnetic region, wherein the fixed magnetic region includes:
       a first ferromagnetic region;
       a coupling layer disposed on and in contact with the first ferromagnetic region;
       a second ferromagnetic region disposed on and in contact with the coupling layer;
       a first interfacial layer disposed on and in contact with the second ferromagnetic region;
       a transition layer disposed on and in contact with the first interfacial layer;
       a second interfacial layer disposed on and in contact with the transition layer;
       a reference layer disposed on and in contact with the second interfacial layer; and
       a third interfacial layer disposed on and in contact with the reference layer;
    at least one dielectric layer disposed on and in contact with the fixed magnetic region;
    a fourth interfacial layer disposed on and in contact with the at least one dielectric layer; and
    a free magnetic region disposed above the interfacial layer.

18. The stack of claim 17, wherein the free magnetic region further comprises one or more insertion layers.

19. The stack of claim 17, wherein one or more interfacial layers of the first, second, third, and fourth interfacial layers, one or more ferromagnetic regions, the reference layer, or a combination thereof includes one or more alloys having the formula XY, where X is selected from a list comprising: cobalt (Co), iron (Fe), nickel (Ni), cobalt-iron (CoFe), iron-nickel (FeNi), and cobalt-nickel (CoNi), and Y is selected from a list comprising: silicon (Si), copper (Cu), rhenium (Re), tin (Sn), boron (B), molybdenum (Mo), ruthenium (Ru), palladium (Pd), osmium (Os), iridium (Ir), rhodium (Rh), platinum (Pt), tungsten (W), and carbon (C).

20. The stack of claim 17, wherein:
   the at least one dielectric layer is a first dielectric layer and the stack further comprises:
      a second dielectric layer disposed above the free magnetic region; and
      a seed region disposed below the fixed region.

\* \* \* \* \*